(12) United States Patent
Isobe et al.

(10) Patent No.: US 10,079,295 B2
(45) Date of Patent: Sep. 18, 2018

(54) SEMICONDUCTOR DEVICE AND METHOD FOR MANUFACTURING THEREOF

(71) Applicant: Semiconductor Energy Laboratory Co., Ltd., Atsugi-shi, Kanagawa-ken (JP)

(72) Inventors: Atsuo Isobe, Isehara (JP); Toshinari Sasaki, Tochigi (JP); Shinya Sasagawa, Chigasaki (JP); Akihiro Ishizuka, Sagamihara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/629,575

(22) Filed: Feb. 24, 2015

(65) Prior Publication Data

US 2015/0179776 A1    Jun. 25, 2015

Related U.S. Application Data

(62) Division of application No. 13/446,028, filed on Apr. 13, 2012, now Pat. No. 9,006,803.

(30) Foreign Application Priority Data

Apr. 22, 2011   (JP) ................. 2011-096298

(51) Int. Cl.
*H01L 29/66* (2006.01)
*H01L 27/06* (2006.01)
(Continued)

(52) U.S. Cl.
CPC .... *H01L 29/66969* (2013.01); *H01L 27/0688* (2013.01); *H01L 27/1225* (2013.01);
(Continued)

(58) Field of Classification Search
None
See application file for complete search history.

(56) References Cited

U.S. PATENT DOCUMENTS

| | | |
|---|---|---|
| 5,712,496 A | 1/1998 | Takahashi et al. |
| 5,731,856 A | 3/1998 | Kim et al. |

(Continued)

FOREIGN PATENT DOCUMENTS

| | | |
|---|---|---|
| EP | 1737044 A | 12/2006 |
| EP | 1921681 A | 5/2008 |

(Continued)

OTHER PUBLICATIONS

Unit Design by Karline Feller & Mike Patterson, Section 2, Polygons—Definitions.*

(Continued)

*Primary Examiner* — Matthew Reames
*Assistant Examiner* — Steven B Gauthier
(74) *Attorney, Agent, or Firm* — Robinson Intellectual Property Law Office; Eric J. Robinson

(57) ABSTRACT

A method for manufacturing an oxide semiconductor layer, comprising forming an oxide semiconductor layer over an insulating layer so as to be along with a curved surface of a projecting structural body of the insulating layer, wherein a length of the projecting structural body in a height direction is larger than a width of the projecting structural body, is provided.

15 Claims, 13 Drawing Sheets

(51) Int. Cl.
*H01L 27/12* (2006.01)
*H01L 29/786* (2006.01)
*H01L 29/423* (2006.01)
*H01L 21/02* (2006.01)

(52) U.S. Cl.
CPC .... *H01L 29/42384* (2013.01); *H01L 29/7869* (2013.01); *H01L 29/78603* (2013.01); *H01L 29/78642* (2013.01); *H01L 29/78696* (2013.01); *H01L 21/02554* (2013.01); *H01L 21/02565* (2013.01); *H01L 21/02667* (2013.01)

(56) References Cited

U.S. PATENT DOCUMENTS

| | | | |
|---|---|---|---|
| 5,744,864 A | 4/1998 | Cillessen et al. | |
| 5,849,612 A | 12/1998 | Takahashi et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,841,797 B2 | 1/2005 | Isobe et al. | |
| 7,038,320 B1* | 5/2006 | You | H01L 21/76802 257/751 |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,439,545 B2 | 10/2008 | Honda | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,463,399 B2 | 12/2008 | Shin et al. | |
| 7,468,304 B2 | 12/2008 | Kaji et al. | |
| 7,501,293 B2 | 3/2009 | Ito et al. | |
| 7,511,343 B2 | 3/2009 | Li et al. | |
| 7,635,889 B2 | 12/2009 | Isa et al. | |
| 7,674,650 B2 | 3/2010 | Akimoto et al. | |
| 7,732,819 B2 | 6/2010 | Akimoto et al. | |
| 7,777,414 B2 | 8/2010 | Honda | |
| 7,893,495 B2 | 2/2011 | Li et al. | |
| 8,034,674 B2 | 10/2011 | Nagai et al. | |
| 8,039,405 B2 | 10/2011 | Miura et al. | |
| 8,188,472 B2 | 5/2012 | Park et al. | |
| 8,202,365 B2 | 6/2012 | Umeda et al. | |
| 8,319,216 B2 | 11/2012 | Akimoto et al. | |
| 8,324,018 B2 | 12/2012 | Isa et al. | |
| 8,378,341 B2 | 2/2013 | Hayashi et al. | |
| 8,502,217 B2 | 8/2013 | Sato et al. | |
| 8,704,267 B2 | 4/2014 | Godo | |
| 8,723,173 B2 | 5/2014 | Yamazaki et al. | |
| 8,748,878 B2 | 6/2014 | Yamaguchi et al. | |
| 9,129,937 B2 | 9/2015 | Hayashi et al. | |
| 9,153,702 B2 | 10/2015 | Yamazaki et al. | |
| 9,312,394 B2 | 4/2016 | Hayashi et al. | |
| 9,647,131 B2 | 5/2017 | Yamazaki et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0196711 A1* | 9/2005 | Shiroguchi | H01L 27/1292 430/330 |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1* | 5/2007 | Akimoto | H01L 29/41733 257/61 |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0121877 A1 | 5/2008 | Ender et al. | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0127552 A1 | 5/2009 | Li et al. | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0096628 A1 | 4/2010 | Song et al. | |
| 2010/0109002 A1 | 5/2010 | Itagaki et al. | |
| 2011/0003418 A1* | 1/2011 | Sakata | H01L 21/02554 438/34 |
| 2012/0187410 A1 | 7/2012 | Yamazaki et al. | |
| 2012/0187417 A1 | 7/2012 | Yamazaki et al. | |
| 2012/0187475 A1 | 7/2012 | Yamazaki et al. | |
| 2012/0267623 A1 | 10/2012 | Isobe et al. | |
| 2012/0267696 A1 | 10/2012 | Isobe et al. | |
| 2012/0267709 A1 | 10/2012 | Isobe et al. | |

(56) References Cited

U.S. PATENT DOCUMENTS

| | | |
|---|---|---|
| 2012/0270375 A1 | 10/2012 | Sasagawa et al. |
| 2016/0211173 A1 | 7/2016 | Hayashi et al. |

FOREIGN PATENT DOCUMENTS

| | | |
|---|---|---|
| EP | 2086014 A | 8/2009 |
| EP | 2172940 A | 4/2010 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-244427 A | 9/1994 |
| JP | 08-023101 A | 1/1996 |
| JP | 08-264794 A | 10/1996 |
| JP | 11-505377 | 5/1999 |
| JP | 2000-026119 A | 1/2000 |
| JP | 2000-044236 A | 2/2000 |
| JP | 2000-150900 A | 5/2000 |
| JP | 2002-076356 A | 3/2002 |
| JP | 3324730 | 9/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-245371 A | 9/2006 |
| JP | 2006-339265 A | 12/2006 |
| JP | 2007-081057 A | 3/2007 |
| JP | 2008-034760 A | 2/2008 |
| JP | 2008-117933 A | 5/2008 |
| JP | 2008-277665 A | 11/2008 |
| JP | 2009-167087 A | 7/2009 |
| JP | 2010-050428 A | 3/2010 |
| JP | 2010-093261 A | 4/2010 |
| JP | 2010-135772 A | 6/2010 |
| JP | 2010-141230 A | 6/2010 |
| KR | 2000-0033991 A | 6/2000 |
| KR | 2005-0093344 A | 9/2005 |
| KR | 2009-0039064 A | 4/2009 |
| KR | 2011-0033056 A | 3/2011 |
| TW | 200830557 | 7/2008 |
| TW | 200941724 | 10/2009 |
| TW | 201027757 | 7/2010 |
| TW | 201030982 | 8/2010 |
| TW | 201041144 | 11/2010 |
| WO | WO-2004/114391 | 12/2004 |
| WO | WO-2009/034953 | 3/2009 |
| WO | WO-2009/072532 | 6/2009 |
| WO | WO-2010/044478 | 4/2010 |

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m=3, 4, and 5), $InGaO_3(ZnO)_3$, and $Ga_2O_3(ZnO)m$ (m=7, 8, 9, and 16) in the $In_2O_3$—$ZnGa_2O_4$—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss For White Tandem OLEDS", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID

(56) References Cited

OTHER PUBLICATIONS

Digest '08 : SID International Symposium Digest of Technical Papers, May 20, 2008, vol. 39, No. 1, pp. 1-4.
Park.J et al., "High performance amorphous oxide thin film transistors with self-aligned top-gate structure", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems", Journal of Solid-State Circuits, 2008, vol. 43, No. 1, pp. 292-299.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.
Park.J et al., "Amorphous Indium-Gallium-Zinc Oxide TFTS and Their Application for Large Size AMOLED", AM-FPD '08 Digest of Technical Papers, Jul. 2, 2008, pp. 275-278.
Park.S et al., "Challenge to Future Displays: Transparent AM-OLED Driven by Peald Grown ZnO TFT", IMID '07 Digest, 2007, pp. 1249-1252.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.
Miyasaka.M, "SUFTLA Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Nakamura.M, "Synthesis of Homologous Compound with New Long-Period Structure", Nirim Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Janotti.A et al., "Oxygen Vacancies in ZnO", Appl. Phys. Lett. (Applied Physics Letters) , 2005, vol. 87, pp. 122102-1-122102-3.
Oba.F et al., "Defect energetics in ZnO: A hybrid Hartree-Fock density functional study", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor", Philosophical Magazine, 2001, vol. 81, No. 5, pp. 501-515.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays", IDW '08 : Proceedings of the 6th International Display Workshops, Dec. 3, 2008, pp. 581-584.
Kim.S et al., "High-Performance oxide thin film transistors passivated by various gas plasmas", 214th ECS Meeting, 2008, No. 2317, ECS.

(56) References Cited

OTHER PUBLICATIONS

Clark.S et al., "First Principles Methods Using CASTEP", Zeitschrift fur Kristallographie, 2005, vol. 220, pp. 567-570.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Taiwanese Office Action (Application No. 101113605) dated Dec. 15, 2015.
International Standard, ISO 4287:1997(E/F), International Organization for Standardization, 1997, pp. ii-vii and 1-26.
Korean Office Action (Application No. 2012-0041410) dated Jul. 13, 2018.

\* cited by examiner

SEMICONDUCTOR DEVICE AND METHOD FOR MANUFACTURING THEREOF

BACKGROUND OF THE INVENTION

1. Field of the Invention

The invention disclosed in this specification relates to a semiconductor device and a method for manufacturing the semiconductor device utilizing a semiconductor element.

2. Description of the Related Art

Attention has been focused on a technique of using a semiconductor thin film formed over a substrate having an insulating surface to form a transistor. The transistor is applied to a wide range of electronic devices such as an integrated circuit (IC) or an image display device (display device). Further, a technique of using a wide band gap semiconductor such as an oxide semiconductor for a semiconductor thin film that can be used for a transistor has been attracting attention.

For example, Patent Document 1 shows that an oxide semiconductor including an In—Ga—Zn—O-based oxide can be used for a channel formation region of a thin film transistor.

REFERENCE

[Patent Document 1] Japanese Published Patent Application No. 2004-103957

SUMMARY OF THE INVENTION

In order to achieve high-speed operation and low power consumption of a transistor, high integration, cost reduction, or the like, it is necessary to miniaturize a transistor.

In the case where a transistor is miniaturized, there is a problem caused by a short channel effect. The short channel effect refers to degradation of electric characteristics which becomes obvious along with miniaturization of a transistor (a decrease in channel length). The short channel effect results from the effect of an electric field of a drain on a source. Specific examples of the short channel effect are a decrease in threshold voltage, an increase in S value (subthreshold swing), an increase in leakage current, and the like. The short channel effect is likely to occur in a transistor including an oxide semiconductor particularly because such a transistor is difficult to control threshold voltage by doping, unlike a transistor including silicon.

Further, the electric characteristics of an oxide semiconductor layer might change due to irradiation with visible light or ultraviolet light, which is a factor of change in the electric characteristics of a transistor including the oxide semiconductor layer, resulting in a reduction in reliability of a semiconductor device.

In view of the above, an object of one embodiment of the disclosed invention is to provide a semiconductor device which is miniaturized and in which defects are suppressed. Further, an object of one embodiment of the disclosed invention is to provide a semiconductor device having stable electric characteristics and high reliability.

In the disclosed invention, an insulating layer is provided with a projecting structural body, and a channel formation region of an oxide semiconductor layer is provided in contact with the projecting structural body, whereby the channel formation region is extended in a three dimensional direction (a direction perpendicular to a substrate). Thus, it is possible to miniaturize a transistor and to extend an effective channel length of the transistor. Further, in the disclosed invention, an upper end corner portion of the projecting structural body, where a top surface and a side surface of the projecting structural body intersect with each other, is curved, and the oxide semiconductor layer is formed to include a crystal having a c-axis perpendicular to the curved surface. Consequently, change in the electric characteristics due to irradiation with visible light or ultraviolet light to the oxide semiconductor can be suppressed. More specifically, for example, the following structures can be employed.

One embodiment of the disclosed invention is a semiconductor device including: an insulating layer provided with a projecting structural body on its surface; an oxide semiconductor layer provided in contact with at least part of a top surface and side surface of the projecting structural body; a gate insulating layer provided over the oxide semiconductor layer; a gate electrode provided over the gate insulating layer to be in contact with at least part of the top surface and side surface of the projecting structural body; and a source electrode and a drain electrode which are electrically connected to the oxide semiconductor layer. In the projecting structural body, a curved surface is formed in an upper end corner portion, where the top surface and the side surface intersect with each other, and the oxide semiconductor layer over the upper end corner portion includes a crystal having a c-axis substantially perpendicular to the curved surface of the upper end corner portion.

In the above, the curved surface of the upper end corner portion preferably has a radius of curvature greater than or equal to 20 nm and less than or equal to 60 nm. The oxide semiconductor layer preferably includes a crystal having a c-axis substantially perpendicular to the surface of the insulating layer. In the insulating layer, the average surface roughness of a surface of the upper end corner portion of the projecting structural body is preferably greater than or equal to 0.1 nm and less than 0.5 nm. Further, the average surface roughness of the surface of the insulating layer is preferably greater than or equal to 0.1 nm and less than 0.5 nm.

One embodiment of the disclosed invention is a method for manufacturing a semiconductor device, which includes the steps of: forming on an insulating layer a projecting structural body in which a curved surface is formed in an upper end corner portion, where a top surface and a side surface of the projecting structural body intersect with each other; forming an oxide semiconductor layer in contact with at least part of the top surface and side surface of the projecting structural body while heat treatment is performed; forming a source electrode and a drain electrode in contact with the oxide semiconductor layer; forming a gate insulating layer over the oxide semiconductor layer; and forming a gate electrode over the gate insulating layer to cover at least part of the top surface and side surface of the projecting structural body.

One embodiment of the disclosed invention is a method for manufacturing a semiconductor device, which includes the steps of: forming on an insulating layer a projecting structural body in which a curved surface is formed in an upper end corner portion, where a top surface and a side surface of the projecting structural body intersect with each other; forming an oxide semiconductor layer which is in contact with at least part of the top surface and side surface of the projecting structural body and in which a crystal having a c-axis substantially perpendicular to the curved surface of the upper end corner portion is included in the oxide semiconductor layer over the upper end corner portion while heat treatment is performed at temperature higher than or equal to 400° C.; forming a source electrode and a drain electrode in contact with the oxide semiconductor layer; forming a gate insulating layer over the oxide semiconductor layer; and forming a gate electrode over the gate insulating layer to cover at least part of the top surface and side surface of the projecting structural body.

One embodiment of the disclosed invention is a method for manufacturing a semiconductor device, which includes the steps of: forming on an insulating layer a projecting structural body in which a curved surface is formed in an upper end corner portion, where a top surface and a side surface of the projecting structural body intersect with each other; forming an amorphous oxide semiconductor layer in contact with at least part of the top surface and side surface of the projecting structural body while heat treatment is performed at temperature lower than 200° C.; heating the amorphous oxide semiconductor layer at temperature higher than or equal to 450° C. so that the oxide semiconductor layer over the upper end corner portion includes a crystal having a c-axis substantially perpendicular to the curved surface of the upper end corner portion; forming a source electrode and a drain electrode in contact with the oxide semiconductor layer; forming a gate insulating layer over the oxide semiconductor layer; and forming a gate electrode over the gate insulating layer to cover at least part of the top surface and side surface of the projecting structural body.

In the above, it is preferable that the insulating layer be etched to form the projecting structural body, and plasma treatment be performed on the projecting structural body in a rare gas atmosphere to form the curved surface in the upper end corner portion, where the top surface and the side surface of the projecting structural body intersect with each other. In addition, argon is preferably used as the rare gas. Alternatively, it is preferable that the insulating layer be etched with the use of a metal mask to form the projecting structural body, and the curved surface be formed in the upper end corner portion, where the top surface and the side surface of the projecting structural body intersect with each other, when the metal mask is removed by dry etching using a reactive gas. The curved surface of the upper end corner portion preferably has a radius of curvature greater than or equal to 20 nm and less than or equal to 60 nm. In the insulating layer, the average surface roughness of a surface of the upper end corner portion of the projecting structural body is preferably greater than or equal to 0.1 nm and less than 0.5 nm.

Note that in this specification and the like, the term such as "over" or "below" does not necessarily mean that a component is placed "directly on" or "directly under" another component. For example, the expression "a gate electrode over a gate insulating layer" does not exclude the case where there is an additional component between the gate insulating layer and the gate electrode.

In addition, in this specification and the like, the term such as "electrode" or "wiring" does not limit a function of a component. For example, an "electrode" is sometimes used as part of a "wiring", and vice versa. In addition, the term "electrode" or "wiring" can also mean a combination of a plurality of "electrodes" and "wirings", for example.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification.

Note that in this specification and the like, the term "electrically connected" includes the case where components are connected through an "object having any electric function". There is no particular limitation on an "object having any electric function" as long as electric signals can be transmitted and received between components that are connected through the object.

Examples of an "object having any electric function" are a switching element such as a transistor, a resistor, an inductor, a capacitor, and an element with a variety of functions as well as an electrode and a wiring.

In this specification and the like, an average surface roughness ($R_a$) is obtained by three-dimension expansion of a center line average roughness ($R_a$) which is defined by JISB0601:2001 (ISO 4287:1997) so as to be applied to a measurement surface, and is an average value of the absolute values of deviations from a reference surface to a specific surface.

Here, the center line average roughness ($R_a$) is shown by the following formula (1) when a portion having a measurement length L is picked up from a roughness curve in the direction of the center line of the roughness curve, the direction of the center line of the roughness curve of the picked portion is an X-axis, the direction of longitudinal magnification (direction perpendicular to the X-axis) is a Y-axis, and the roughness curve is expressed as Y=F(X).

[Formula 1]

$$R_a = \frac{1}{L}\int_0^L |F(X)|dX \qquad (1)$$

When the measurement surface which is a surface represented by measurement data is expressed as Z=F(X,Y), the average surface roughness ($R_a$) is an average value of the absolute values of deviations from the reference surface to the specific surface and is shown by the following formula (2).

[Formula 2]

$$R_a = \frac{1}{S_0}\int_{Y_1}^{Y_2}\int_{X_1}^{X_2} |F(X, Y) - Z_0|dXdY \qquad (2)$$

Here, the specific surface is a surface which is a target of roughness measurement, and is a rectangular region which is surrounded by four points represented by the coordinates $(X_1,Y_1)$, $(X_1,Y_2)$, $(X_2,Y_1)$, and $(X_2,Y_2)$. $S_0$ represents the area of the specific surface when the specific surface is flat ideally.

In addition, the reference surface refers to a surface parallel to an X-Y surface at the average height of the specific surface. In short, when the average value of the height of the specific surface is denoted by $Z_0$, the height of the reference surface is also denoted by $Z_0$.

According to one embodiment of the disclosed invention, a semiconductor device which is miniaturized and in which defects are suppressed can be provided. Further, according to one embodiment of the disclosed invention, a semiconductor device having stable electric characteristics and high reliability can be provided.

Further, according to one embodiment of the disclosed invention, the size of a transistor can be sufficiently reduced. When the size of the transistor is sufficiently reduced, the area of a semiconductor device is also reduced and thus the number of semiconductor devices manufactured from one substrate is increased. Thus, manufacturing costs of the semiconductor device can be saved. Since the semiconductor device is downsized, a semiconductor device with a size similar to that of the conventional semiconductor device can have improved functions. Further, the semiconductor device can be highly integrated. Furthermore, effects of high-speed operation, low power consumption, and the like can be obtained because of a reduction in channel length.

DETAILED DESCRIPTION OF THE INVENTION

Figure 1A:
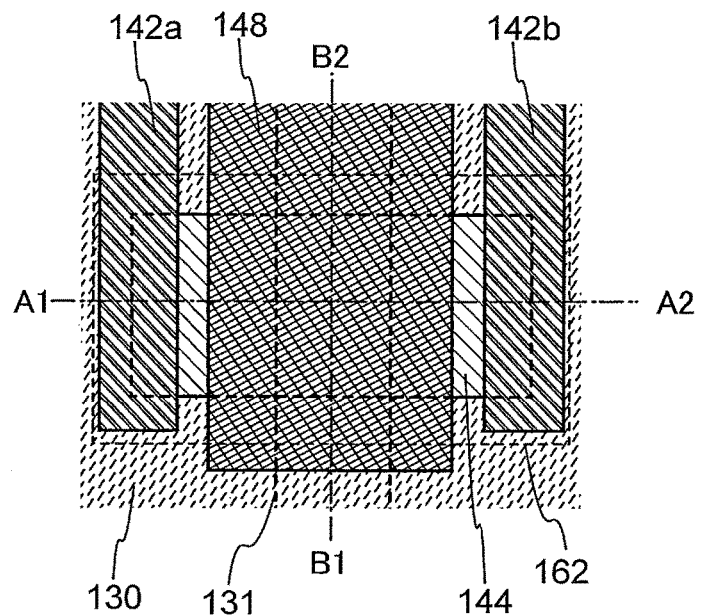
FIGS. 1A and 1B are a plane view and a cross-sectional view each illustrating a semiconductor device according to one embodiment of the present invention.

Hereinafter, embodiments of the present invention will be described with reference to the drawings. Note that the present invention is not limited to the following description and it will be readily appreciated by those skilled in the art that modes and details can be modified in various ways without departing from the spirit and the scope of the present invention. Therefore, the invention should not be construed as being limited to the description in the following embodiments. In the following embodiments and example, the same portions or portions having similar functions are denoted by the same reference numerals in different drawings, and explanation thereof will not be repeated.

Note that the position, size, range, or the like of each structure illustrated in the drawings and the like is not accurately represented in some cases for easy understanding. Therefore, the disclosed invention is not necessarily limited to the position, size, range, or the like as disclosed in the drawings and the like.

Note that in this specification and the like, ordinal numbers such as "first", "second", and "third" are used in order to avoid confusion among components, and the terms do not mean limitation of the number of components.

(Embodiment 1)

In this embodiment, as one embodiment of the present invention, a semiconductor device including an oxide semiconductor and a method for manufacturing the semiconductor device will be described with reference to FIGS. 1A and 1B, FIGS. 2A to 2E, FIGS. 3A to 3C, and FIGS. 4A to 4C.

Figure 1B:
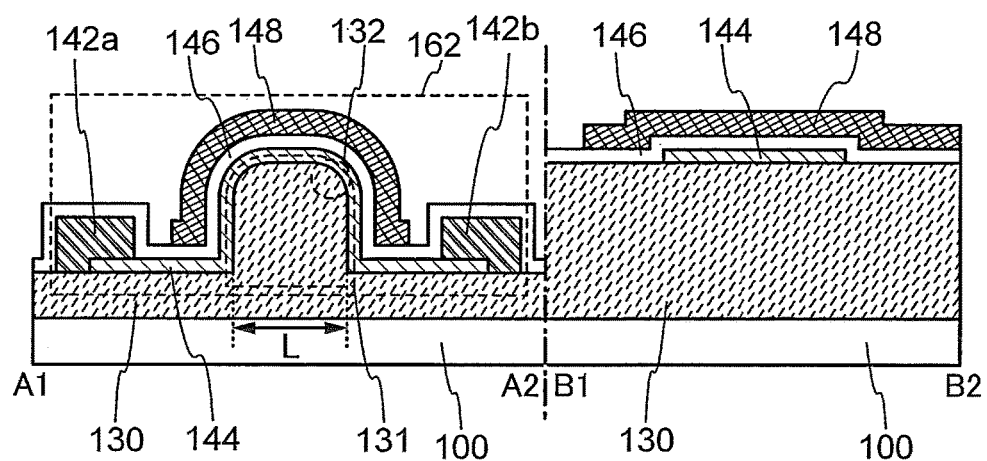

FIGS. 1A and 1B are a plan view and a cross-sectional view each illustrate a transistor 162 as an example of a semiconductor device according to one embodiment of the present invention. Here, FIG. 1B corresponds to cross sections along a line A1-A2 and a line B1-B2 in FIG. 1A.

The transistor 162 illustrated in FIGS. 1A and 1B includes an insulating layer 130 which is formed over a substrate 100 and provided with a projecting structural body 131 on its surface, an oxide semiconductor layer 144 provided in contact with at least part of a top surface and side surface of the projecting structural body 131, a gate insulating layer 146 provided over the oxide semiconductor layer 144, a gate electrode 148 provided over the gate insulating layer 146 to cover at least part of the top surface and side surface of the projecting structural body 131, and a source electrode 142*a* and a drain electrode 142*b* which are electrically connected to the oxide semiconductor layer 144.

The projecting structural body 131 is provided on the surface of the insulating layer 130 and the oxide semiconductor layer 144 is provided in contact with at least part of the top surface and side surface of the projecting structural body 131. Thus, a cross-sectional shape of the oxide semiconductor layer 144 in a channel length direction (a direction of flow of carriers), is curved along a cross-sectional shape of the projecting structural body 131. As the height of the projecting structural body 131 increases, an effective channel length of the transistor 162 can increase. Here, the projecting structural body 131 is preferably provided so that the effective channel length is greater than or equal to 2L when the width of the projecting structural body 131 in the channel length direction, is L.

A channel formation region of the oxide semiconductor layer 144 can be extended in a three dimensional direction (a direction perpendicular to the substrate) by appropriately setting the height of the projecting structural body 131. Thus, the effective channel length can be kept or extended even when the transistor 162 is miniaturized and the distance between the source electrode 142*a* and the drain electrode 142*b* is short. Therefore, occurrence of a short-channel effect in the transistor 162 can be suppressed and the transistor 162 is miniaturized.

Thus, the size of the transistor 162 can be sufficiently reduced, which leads to a decrease in the area of the semiconductor device and an increase in the number of semiconductor devices manufactured from one substrate. Thus, manufacturing costs of the semiconductor device can be saved. Since the semiconductor device is downsized, a semiconductor device with a size similar to that of the conventional semiconductor device can have improved functions. Further, high integration of the semiconductor device is possible. Furthermore, effects of high-speed operation, low power consumption, and the like can be obtained because of a reduction in channel length.

Part of the projecting structural body 131 provided on the surface of the insulating layer 130, where the top surface and the side surface of the projecting structural body 131 intersect with each other, (hereinafter referred to as an upper end corner portion 132) is curved. The curved surface of the upper end corner portion 132 preferably has a radius of curvature greater than or equal to 20 nm and less than or equal to 60 nm A surface of the upper end corner portion 132 is preferably as flat as possible and the average surface roughness thereof is preferably greater than or equal to 0.1 nm and less than 0.5 nm, for example. The oxide semiconductor layer 144 is provided in contact with at least part of the top surface and side surface of the projecting structural body 131 provided with such an upper end corner portion 132, so that change in the electric characteristics due to irradiation with visible light or ultraviolet light to the oxide semiconductor layer 144 can be suppressed.

It is more preferable that not only the curved surface of the upper end corner portion of the projecting structural body 131 but also a surface of the insulating layer 130, which is in contact with the oxide semiconductor layer 144, be as flat as possible and the average surface roughness thereof be greater than or equal to 0.1 nm and less than 0.5 nm, for example.

For the oxide semiconductor layer 144, an oxide semiconductor having a wider band gap than that of silicon, i.e., 1.1 eV, is preferably used. For example, an In—Ga—Zn—O-based oxide semiconductor having a band gap of 3.15 eV, indium oxide having a band gap of about 3.0 eV, indium tin oxide having a band gap of about 3.0 eV, indium gallium oxide having a band gap of about 3.3 eV, indium zinc oxide having a band gap of about 2.7 eV, tin oxide having a band gap of about 3.3 eV, zinc oxide having a band gap of about 3.37 eV, or the like can be preferably used. With the use of such a material, it is possible to keep the off-state current of the transistor 162 extremely low.

Here, it is desirable that the oxide semiconductor layer 144 included in the transistor 162 be highly purified by sufficient removal of impurities such as hydrogen and sufficient supply of oxygen. Specifically, the concentration of hydrogen in the oxide semiconductor layer 144 is lower than or equal to $5\times10^{19}$ atoms/cm$^3$, desirably lower than or equal to $5\times10^{18}$ atoms/cm$^3$, more desirably lower than or equal to $5\times10^{17}$ atoms/cm$^3$. Note that the concentration of hydrogen in the oxide semiconductor layer 144 is measured by secondary ion mass spectrometry (SIMS). The carrier concentration of the oxide semiconductor layer 144, which is highly purified by sufficient reduction of the concentration of hydrogen therein and in which defect levels in an energy gap due to oxygen deficiency are reduced by sufficient supply of oxygen, is lower than $1\times10^{12}$/cm$^3$, desirably lower than $1\times10^{11}$/cm$^3$, more desirably lower than $1.45\times10^{10}$/cm$^3$. For example, the off-state current (per unit channel width (1 μm) here) at room temperature (25° C.) is less than or equal to 100 zA (1 zA (zeptoampere) is $1\times10^{-21}$ A), desirably less than or equal to 10 zA/μm, more desirably less than or equal to 100 yA (1 yA (yoctoampere) is $1\times10^{-24}$ A). As described above, with the use of an oxide semiconductor which is made to be an i-type (intrinsic) or a substantially i-type oxide semiconductor, the transistor 162 with excellent off-state current characteristics can be obtained.

Further, it is preferable that the oxide semiconductor layer 144 have crystallinity and be a crystalline oxide semiconductor film with c-axis orientation (CAAC-OS (c-axis aligned crystalline oxide semiconductor) film).

The CAAC-OS film is not completely a single crystal nor completely amorphous. The CAAC-OS film is an oxide semiconductor film with a crystal-amorphous mixed phase structure where crystal portions and amorphous portions are included in an amorphous phase. Note that in most cases, the crystal portion fits inside a cube whose one side is less than 100 nm From an observation image obtained with a transmission electron microscope (TEM), a boundary between an amorphous portion and a crystal portion in the CAAC-OS film is not clear. Further, with the TEM, a grain boundary in the CAAC-OS film is not found. Thus, a reduction in the electron mobility due to a grain boundary is suppressed in the CAAC-OS.

In each of the crystal portions included in the CAAC-OS film, the c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal portions, the directions of the a-axis and the b-axis of one crystal portion may be different from those of another crystal portion. In this specification, a simple term "perpendicular" includes a range from 85° to 95°. In addition, a simple term "parallel" includes a range from −5° to 5°.

In the CAAC-OS film, distribution of crystal portions is not necessarily uniform. For example, in the formation process of the CAAC-OS film, in the case where crystal growth occurs from a surface side of the oxide semiconductor film, the proportion of crystal portions in the vicinity of the surface of the oxide semiconductor film is higher than that in the vicinity of the surface where the oxide semiconductor film is formed in some cases. Further, when an impurity is added to the CAAC-OS film, the crystal portion in a region to which the impurity is added becomes amorphous in some cases.

Since the c-axes of the crystal portions included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of the c-axis of the crystal portion is the direction parallel to a normal vector of the surface where the CAAC-OS film is formed or a normal vector of the surface of the CAAC-OS film. The crystal portion is formed by film formation or by treatment for crystallization such as heat treatment after film formation.

Nitrogen may be substituted for part of oxygen included in the CAAC-OS film.

Here, in the case where the surface of the insulating layer 130 is less flat or the upper end corner portion 132 is not curved, continuity of a growth surface of a crystal included in the oxide semiconductor layer 144 might be broken and the crystallinity of the oxide semiconductor layer 144 might be reduced.

However, as described above, the oxide semiconductor layer 144 is provided over and in contact with the insulating layer 130 having a surface with improved flatness, thereby increasing the continuity of the growth surface of the crystal included in the oxide semiconductor layer 144, which leads to increase of the crystallinity of the oxide semiconductor layer 144.

In addition, as described above, the upper end corner portion 132 of the projecting structural body 131 is curved, so that a large number of crystals each having a c-axis substantially perpendicular to the curved surface of the upper end corner portion 132 can be included in the oxide semiconductor layer 144. More preferably, the oxide semiconductor layer 144 includes a crystal having a continuous growth surface and metal atoms arranged in a layered manner to the curved surface of the upper end corner portion 132. Further, as described above, with the upper end corner portion 132 having a surface with increased flatness, the crystallinity of the oxide semiconductor layer 144 at the upper end corner portion 132 can be further improved.

Provision of the oxide semiconductor layer 144 including a crystal with c-axis orientation can suppress change in the electric characteristics due to irradiation with visible light or ultraviolet light. Thus, with the oxide semiconductor layer 144, a semiconductor device with stable electric characteristics and high reliability can be provided.

Next, as an example of a method for manufacturing the semiconductor device according to one embodiment of the present invention, a method for manufacturing the transistor 162 will be described with reference to FIGS. 2A to 2E, FIGS. 3A to 3C, and FIGS. 4A to 4C. A cross-sectional view of the transistor 162 illustrated in each of FIGS. 2A to 2E, FIGS. 3A to 3C, and FIGS. 4A to 4C corresponds to the cross-sectional view of the transistor 162, which is along a line A1-A2 in FIG. 1B.

Figure 2A:
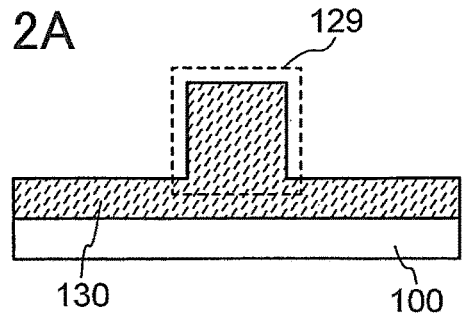
FIGS. 2A to 2E are cross-sectional views illustrating steps for manufacturing a semiconductor device according to one embodiment of the present invention.

First, the insulating layer 130 is formed over the substrate 100 and the insulating layer 130 is provided with a projecting structural body 129 on its surface (see FIG. 2A).

Although there is no particular limitation on a substrate that can be used as the substrate 100, it is necessary that the substrate have at least heat resistance high enough to withstand heat treatment performed later. For example, a glass substrate of aluminosilicate glass, aluminoborosilicate glass, barium borosilicate glass, or the like; a ceramic substrate; a quartz substrate; or a sapphire substrate can be used. Alternatively, a single crystal semiconductor substrate or a polycrystalline semiconductor substrate formed using silicon, silicon carbide, or the like; a compound semiconductor substrate of silicon germanium or the like; an SOI substrate; or the like can be used, and a semiconductor element may be provided over the substrate. Further alternatively, a substrate obtained by forming an insulating layer over a surface of a semiconductor substrate of silicon or the like or a surface of a conductive substrate formed of a metal material can be used. Note that in general, the term "SOI substrate" means a substrate where a silicon semiconductor layer is provided on an insulating surface. In this specification and the like, the term "SOI substrate" also includes a substrate where a semiconductor layer formed using a material other than silicon is provided over an insulating surface in its category. That is, a semiconductor layer included in the "SOI substrate" is not limited to a silicon semiconductor layer. The SOI substrate can be a substrate having a structure in which a semiconductor layer is provided over an insulating substrate such as a glass substrate, with an insulating layer provided therebetween.

As the insulating layer 130, a silicon oxide film, a gallium oxide film, an aluminum oxide film, a silicon oxynitride film, an aluminum oxynitride film, or the like can be formed. In this embodiment, a silicon oxide film is used as the insulating layer 130. Note that a film formation method such as a CVD method or a sputtering method may be appropriately used for forming the insulating layer 130.

Here, the insulating layer 130 preferably contains oxygen. Since the oxide semiconductor layer 144 is formed over and in contact with the insulating layer 130 in a later step, by making the insulating layer 130 contain oxygen, extraction of oxygen from the oxide semiconductor layer 144 into the insulating layer 130 can be suppressed when heat treatment or the like is performed in a later step. In addition, the insulating layer 130 is preferably formed using an oxide insulating layer from which part of oxygen is released by heating. The oxide insulating layer from which part of oxygen is released by heating is preferably an oxide insulating layer which contains oxygen whose amount exceeds the amount of oxygen satisfying the stoichiometric proportion. With the use of the oxide insulating layer from which part of oxygen is released by heating as the insulating layer 130, oxygen can be diffused into the oxide semiconductor layer 144 when heat treatment is performed in a later step. Note that an ion implantation method, an ion doping method, or the like may be employed to add oxygen to the insulating layer 130.

The projecting structural body 129 can be formed by performing etching or the like so that a region of the insulating layer 130, where the projecting structural body 129 is formed, is selectively left. For example, etching can be performed once or plural times to form the projecting structural body 129.

Dry etching is preferably used as a method for etching the insulating layer 130 in view of miniaturization. An etching gas and etching conditions can be set as appropriate depending on the material or the like of the insulating layer 130. A fluorocarbon-based gas or a mixed gas containing a fluorocarbon-based gas is preferably used. For example, a mixed gas of $CHF_3$ and He, a mixed gas of $CHF_3$, $CH_4$, and He, a mixed gas of $CF_4$ and $H_2$, a mixed gas of $C_4F_8$ and Ar, a mixed gas of $CHF_3$, $CF_4$, and Ar, or the like can be used. In this embodiment, a mixed gas of $CHF_3$, $CH_4$, and He is used as the etching gas. In the case of performing a plural times of etching, the dry etching may be combined with wet etching.

Next, the upper end corner portion 132 where the top surface and the side surface of the projecting structural body 129 intersect with each other is subjected to processing to form a curved surface (hereinafter referred to as R processing), so that the projecting structural body 131 provided with the curved upper end corner portion 132 is formed (see FIG. 2B). Here, the curved surface of the upper end corner portion 132 preferably has a radius of curvature greater than or equal to 20 nm and less than or equal to 60 nm. Further, the projecting structural body 131 is preferably provided so that the effective channel length of the transistor 162 is greater than or equal to 2L when the width of the projecting structural body 131 in the channel length direction, is L.

Plasma treatment can be preferably used as the R processing for curving the upper end corner portion 132. The plasma treatment is performed in such a manner that an inert gas, e.g., a rare gas such as an argon gas is introduced into a vacuum chamber and an electric field is applied so that a surface to be processed serves as a cathode. The plasma treatment has a principle similar to that of a plasma dry etching method and an inert gas is used in the plasma treatment. That is, the plasma treatment is treatment to planarize minute unevenness of the surface to be processed due to a sputtering effect by irradiating the surface with ions of an inert gas. A rare gas element having a large mass number, such as argon, krypton, or xenon, is preferably used for the rare gas.

When the plasma treatment is performed, electrons and argon cations are present in plasma and the argon cations are accelerated in a cathode direction. The surface to be processed is sputtered by the accelerated argon cations. At this time, a projected portion of the surface to be processed is preferentially sputtered, so that the upper end corner portion 132 is preferentially subjected to R processing through sputtering treatment. In such a manner, the projecting structural body 131 provided with the upper end corner portion 132 is formed.

Note that through the plasma treatment, it is possible to remove impurities, such as oxygen, moisture, and an organic compound, attached onto the surface of the insulating layer 130 by a sputtering effect. Further, it is also possible to planarize the surface of the insulating layer 130 (including the projecting structural body 131). For example, the surface of the insulating layer 130 is planarized to reduce the surface roughness thereof, so that the average surface roughness of the insulating layer 130 can be preferably greater than or equal to 0.1 nm and less than 0.5 nm.

Figure 2B:
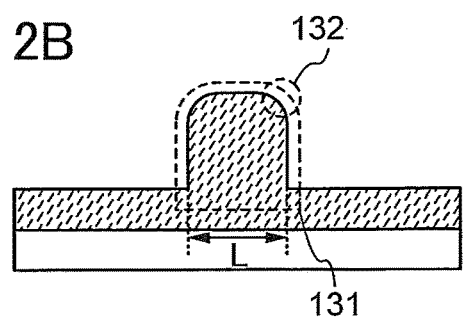

In FIG. 2B, the side surface of the projecting structural body 131 is formed to be substantially perpendicular to a surface of the substrate 100, and the side surface of the projecting structural body 131 and a surface of a region in the insulating layer 130, where the projecting structural body 131 is not formed, are in contact with each other to form a substantially right angle; however, this embodiment is not limited thereto. The projecting structural body 131 may be formed to have a tapered cross section through the steps illustrated in FIG. 2A or FIG. 2B. Further, the portion in which the side surface of the projecting structural body 131 is in contact with the surface of the region in the insulating layer 130, where the projecting structural body 131 is not formed, may be curved. With the projecting structural body 131 having such a shape, coverage with the oxide semiconductor layer 144 formed over the projecting structural body can be improved.

Note that before the film formation of the oxide semiconductor, it is preferable that a treatment chamber be heated and evacuated to remove impurities, such as hydrogen, water, a hydroxyl group, and hydride, in the treatment chamber. It is particularly important to remove the impurities adsorbed on an inner wall of the treatment chamber. Here, heat treatment may be performed at temperature higher than or equal to 100° C. and lower than or equal to 450° C. Evacuation of the treatment chamber is preferably performed with a rough vacuum pump, such as a dry pump, and a high vacuum pump, such as a sputter ion pump, a turbo molecular pump, or a cryopump, in appropriate combination. The turbo molecular pump has an outstanding capability in evacuating a large-sized molecule, whereas it has a low capability in evacuating hydrogen and water. Further, combination with a cryopump having a high capability in evacuating water or a sputter ion pump having a high capability in evacuating hydrogen is effective. At this time, when the impurities are removed while an inert gas is introduced, the rate of elimination of water or the like, which is difficult to eliminate only by evacuation, can be further increased. Removal of impurities in the treatment chamber by such treatment before the film formation of the oxide semiconductor can prevent hydrogen, water, a hydroxyl group, hydride, and the like from entering the oxide semiconductor layer 144.

Figure 2C:
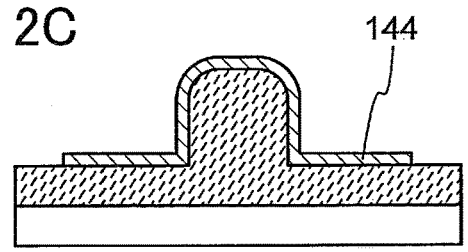

Next, the oxide semiconductor is deposited while the substrate 100 is heated, whereby the oxide semiconductor layer 144 is formed in contact with at least part of the top surface and side surface of the projecting structural body 131 provided on the surface of the insulating layer 130 (see FIG. 2C). Here, the substrate is heated so that the substrate temperature is higher than 200° C. and lower than or equal to 700° C., preferably higher than 300° C. and lower than or equal to 500° C., more preferably higher than or equal to 400° C. and lower than or equal to 450° C. Note that the oxide semiconductor layer may be formed to be thin and heated at temperature in the above range and another oxide semiconductor layer may be formed over the oxide semiconductor layer.

The oxide semiconductor layer 144 is formed to have a thickness greater than or equal to 1 nm and less than or equal to 100 nm, and a sputtering method, a molecular beam epitaxy (MBE) method, a pulse laser deposition method, an atomic layer deposition (ALD) method, or the like can be used as appropriate for forming the oxide semiconductor layer 144. The oxide semiconductor layer 144 may be formed using a sputtering apparatus which performs film formation with surfaces of a plurality of substrates set substantially perpendicular to a surface of a sputtering target, which is so called a columnar plasma (CP) sputtering system.

As a material of the oxide semiconductor layer 144, an oxide semiconductor having a band gap wider than at least silicon is used. Examples of an oxide semiconductor having a band gap wider than that of silicon include a four-component metal oxide such as an In—Sn—Ga—Zn—O-based oxide semiconductor; three-component metal oxides such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, a Sn—Al—Zn—O-based oxide semiconductor, and a Hf—In—Zn—O-based oxide semiconductor; two-component metal oxides such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, and an In—Ga—O-based oxide semiconductor; single-component metal oxides such as an In—O-based oxide semiconductor, a Sn—O-based oxide semiconductor, and a Zn—O-based oxide semiconductor; and the like. In this embodiment, an In—Ga—Zn—O-based oxide semiconductor is used.

Note that for example, an In—Ga—Zn—O-based oxide semiconductor refers to an oxide semiconductor containing indium (In), gallium (Ga), and zinc (Zn), and there is no limitation on the composition ratio thereof.

As the oxide semiconductor layer 144, a thin film expressed by a chemical formula of $InMO_3(ZnO)_m$ (m>0) can be used. Here, M represents one or more metal elements selected from Zn, Ga, Al, Mn, and Co. For example, M can be Ga, Ga and Al, Ga and Mn, Ga and Co, or the like.

When an In—Ga—Zn—O-based material is used for the oxide semiconductor, for example, an oxide target having a composition ratio of $In_2O_3:Ga_2O_3:ZnO=1:1:1$ [molar ratio] can be used as a target. Without limitation to the material and the component of the target, for example, an oxide target having a composition ratio of $In_2O_3:Ga_2O_3:ZnO=1:1:2$ [molar ratio] may be used.

In the case where an In—Sn—Zn—O-based material is used for the oxide semiconductor, the composition ratio of the target may be In:Sn:Zn=1:2:2, In:Sn:Zn=2:1:3, In:Sn:Zn=1:1:1, or the like in an atomic ratio.

In the case where an In—Zn—O-based material is used for the oxide semiconductor, a target therefor has a composition ratio of In:Zn=50:1 to 1:2 in an atomic ratio (In$_2$O$_3$:ZnO=25:1 to 1:4 in a molar ratio), preferably In:Zn=20:1 to 1:1 in an atomic ratio (In$_2$O$_3$:ZnO=10:1 to 1:2 in a molar ratio), further preferably In:Zn=15:1 to 1.5:1 in an atomic ratio (In$_2$O$_3$:ZnO=15:2 to 3:4 in a molar ratio). For example, in a target used for formation of an In—Zn—O-based oxide semiconductor with an atomic ratio of In:Zn:O=X:Y:Z, the relation of Z>1.5X+Y is satisfied.

Atmosphere of the film formation may be a rare gas (typically argon) atmosphere, an oxygen atmosphere, or a mixed atmosphere containing a rare gas and oxygen. Here, when the volume of oxygen is larger than the volume of a rare gas at the time of the film formation, supply of oxygen into the oxide semiconductor layer 144 can be facilitated and oxygen deficiency in the oxide semiconductor layer 144 can be reduced. In order to prevent hydrogen, water, a hydroxyl group, hydride, and the like from entering the oxide semiconductor layer 144, an atmosphere of a high-purity gas from which impurities such as hydrogen, water, a hydroxyl group, and hydride are sufficiently removed is preferable.

The oxide semiconductor layer 144 is formed in such a manner, whereby the crystalline oxide semiconductor layer 144 having c-axis orientation can be formed. Here, the oxide semiconductor layer 144 is formed over and in contact with the projecting structural body 131 provided with the upper end corner portion 132 which is has a curved surface, so that the oxide semiconductor layer 144 can include a large number of crystals each having a c-axis substantially perpendicular to the curved surface of the upper end corner portion 132. More preferably, the oxide semiconductor layer 144 includes a crystal having a continuous growth surface and metal atoms arranged in a layered manner to the curved surface of the upper end corner portion 132. Further, as described above, the surface of the insulating layer 130 including the upper end corner portion 132 has increased flatness, whereby the continuity of the growth surface of the crystal included in the oxide semiconductor layer 144 is increased, resulting in more increase in the crystallinity of the oxide semiconductor layer 144.

Provision of the oxide semiconductor layer 144 including a crystal with c-axis orientation can suppress change in the electric characteristics due to irradiation with visible light or ultraviolet light. Thus, with the oxide semiconductor layer 144, a semiconductor device with stable electric characteristics and high reliability can be provided.

The upper end corner portion 132 of the projecting structural body 131 is provided with the curved surface and the flatness of the surface of the insulating layer 130 including the upper end corner portion 132 is increased in such a manner, whereby coverage with the oxide semiconductor layer 144 can be improved.

After the oxide semiconductor layer 144 is formed, heat treatment (first heat treatment) may be performed on the oxide semiconductor layer 144. The heat treatment can remove substances including hydrogen atoms in the oxide semiconductor layer 144, and can order a structure of the oxide semiconductor layer 144, whereby defect level in energy gap can be reduced. The heat treatment is performed in an inert gas atmosphere at temperature higher than or equal to 300° C. and lower than or equal to 700° C., preferably higher than or equal to 450° C. and lower than or equal to 600° C., or less than a strain point of the substrate in the case where the substrate has the strain point. The inert gas atmosphere is preferably an atmosphere which contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is greater than or equal to 6 N (99.9999%), preferably greater than or equal to 7 N (99.99999%) (that is, the concentration of the impurities is less than or equal to 1 ppm, preferably less than or equal to 0.1 ppm).

For example, after the substrate 100 is introduced into an electric furnace including a resistance heater or the like, the heat treatment can be performed at 450° C. for one hour in a nitrogen atmosphere.

The heat treatment apparatus is not limited to the electric furnace and may be an apparatus for heating an object to be processed by thermal conduction or thermal radiation from a medium such as a heated gas. For example, a rapid thermal annealing (RTA) apparatus such as a lamp rapid thermal annealing (LRTA) apparatus or a gas rapid thermal annealing (GRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, such as nitrogen or a rare gas such as argon is used. Note that in the case where a GRTA apparatus is used as the heat treatment apparatus, the substrate may be heated in an inert gas heated to high temperature of 650° C. to 700° C. because the heat treatment time is short.

In addition, it is preferable that after the oxide semiconductor layer 144 is heated through the heat treatment, a high-purity oxygen gas, a high-purity N$_2$O gas, or ultra-dry air (the amount of moisture is less than or equal to 20 ppm (−55° C. by conversion into a dew point), preferably less than or equal to 1 ppm, or more preferably less than or equal to 10 ppb, when measured with a dew point meter of a cavity ring down laser spectroscopy (CRDS) system) be introduced into the same furnace. It is preferable that water, hydrogen, and the like be not contained in these gases in particular. The purity of the oxygen gas or the N$_2$O gas that is introduced into the same furnace is preferably greater than or equal to 6N, more preferably greater than or equal to 7N (i.e., the concentration of impurities in the oxygen gas or the N$_2$O gas is preferably less than or equal to 1 ppm, more preferably less than or equal to 0.1 ppm). By the action of the oxygen gas or the N$_2$O gas, oxygen which is one of a main component of the oxide semiconductor and which has been reduced through the step for removing impurities by dehydration or dehydrogenation can be supplied. Through this step, the oxide semiconductor layer can be highly purified and made to be an i-type (intrinsic) oxide semiconductor.

The impurities are reduced by the heat treatment, leading to formation of an i-type oxide semiconductor layer (an intrinsic oxide semiconductor layer) or a substantially i-type oxide semiconductor layer. Thus, a transistor having excellent characteristics can be realized.

The above heat treatment has an effect of removing hydrogen, water, and the like and can be referred to as dehydration, dehydrogenation, or the like. The heat treatment can be performed at the timing, for example, before the oxide semiconductor layer is processed to have an island shape, after the gate insulating layer is formed, or the like. The number of times of such heat treatment for dehydration or dehydrogenation is not limited to one and may be two or more.

Note that in FIG. 2C, the oxide semiconductor layer 144 is processed to be an island shape; however, the oxide semiconductor layer 144 is not necessarily processed to be an island shape.

Figure 2D:
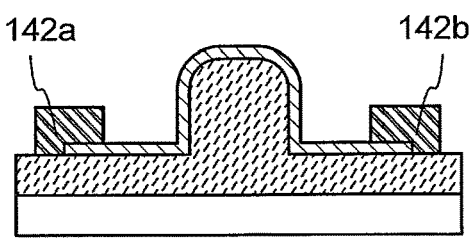

Next, a conductive layer is formed over the oxide semiconductor layer 144 and the conductive layer is processed to form the source electrode 142a and the drain electrode 142b which are electrically connected to the oxide semiconductor layer 144 (see FIG. 2D).

The source electrode 142a and the drain electrode 142b can be formed using a metal material such as molybdenum, titanium, tantalum, tungsten, aluminum, copper, chromium, neodymium, or scandium, or an alloy material containing any of these metal materials as a main component.

Note that in a structure illustrated in FIG. 2D, the source electrode 142a and the drain electrode 142b are formed over the oxide semiconductor layer 144; however, this embodiment is not limited thereto. The oxide semiconductor layer 144 may be provided over the source electrode 142a and the drain electrode 142b which are formed in advance. Further, the source electrode 142a and the drain electrode 142b each having a tapered cross section enable increase in coverage with the gate insulating layer 146 formed over and in contact with the source electrode 142a and the drain electrode 142b.

Figure 2E:
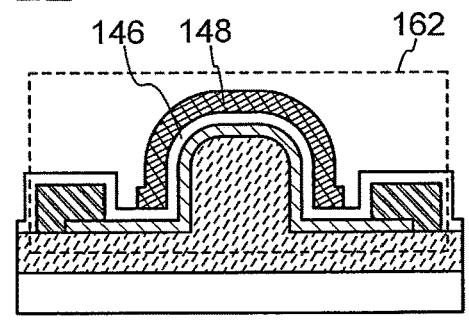

Next, the gate insulating layer 146 is formed over the oxide semiconductor layer 144, the source electrode 142a, and the drain electrode 142b (see FIG. 2E).

The thickness of the gate insulating layer 146 is greater than or equal to 1 nm and less than or equal to 100 nm. The gate insulating layer 146 can be formed by a sputtering method, an MBE method, a CVD method, a pulsed laser deposition method, an ALD method, or the like as appropriate. In consideration of being in contact with the oxide semiconductor layer 144, the gate insulating layer 146 is preferably a layer from which impurities such as hydrogen are sufficiently reduced; therefore, a sputtering method with which impurities such as hydrogen are less likely to contain is preferably used for forming the gate insulating layer 146.

The gate insulating layer 146 can be formed using a silicon oxide film, a gallium oxide film, an aluminum oxide film, a silicon oxynitride film, an aluminum oxynitride film, or the like. Further, the gate insulating layer 146 is preferably formed in consideration of the size of a transistor to be formed and the step coverage with the gate insulating layer 146.

Here, it is preferable that the gate insulating layer 146 contain oxygen as well as the insulating layer 130. Since the gate insulating layer 146 is formed over and in contact with the oxide semiconductor layer 144, with the gate insulating layer 146 containing oxygen, extraction of oxygen from the oxide semiconductor layer 144 into the gate insulating layer 146 can be prevented at the time of heat treatment in a later step. In addition, an oxide insulating layer from which part of contained oxygen is released due to heat treatment can be preferably used for forming the gate insulating layer 146. As the oxide insulating layer from which part of contained oxygen is released due to heat treatment, an oxide insulating layer which contains oxygen whose amount exceeds the amount of oxygen satisfying the stoichiometric proportion is preferably used. When the oxide insulating layer from which part of contained oxygen is released due to heat treatment is used as the gate insulating layer 146, oxygen can be diffused into the oxide semiconductor layer 144 at the time of heat treatment in a later step.

In this embodiment, a silicon oxide film of $SiO_{2+\alpha}$ ($\alpha>0$) is used as the gate insulating layer 146. When the silicon oxide film is used as the gate insulating layer 146, oxygen can be supplied to the In—Ga—Zn—O-based oxide semiconductor and favorable characteristics can be obtained.

Further, gate leakage current can be reduced with the use of a high-k material for the gate insulating layer 146. Examples of the high-k material include hafnium oxide, yttrium oxide, hafnium silicate ($HfSi_xO_y$, ($x>0$, $y>0$)), hafnium aluminate ($HfAl_xO_y$, ($x>0$, $y>0$)), hafnium silicate to which nitrogen is added, hafnium alumitate to which nitrogen is added, lanthanum oxide, and the like. In addition, the gate insulating layer 146 may have a single-layer structure or a stacked-layer structure.

After the gate insulating layer 146 is formed, heat treatment (second heat treatment) may be performed in an inert gas atmosphere or an oxygen atmosphere. The heat treatment is preferably performed at temperature higher than or equal to 200° C. and lower than or equal to 450° C., and more preferably higher than or equal to 250° C. and lower than or equal to 350° C. With such heat treatment, variation in electric characteristics of the transistor can be reduced. Further, in the case where the gate insulating layer 146 in contact with the oxide semiconductor layer 144 contains oxygen, oxygen is supplied to the oxide semiconductor layer 144 to cover oxygen deficiency in the oxide semiconductor layer 144, so that an i-type (intrinsic semiconductor) or substantially i-type oxide semiconductor layer can be formed. As described above, the heat treatment has an effect of supplying oxygen; therefore, the heat treatment can also be referred to as supply of oxygen.

Note that in this embodiment, the heat treatment for supply of oxygen is performed after the gate insulating layer 146 is formed; however, the timing of the heat treatment for supply of oxygen is not limited thereto. For example, the heat treatment for supply of oxygen may be performed after the source electrode 142a and the drain electrode 142b are formed. Alternatively, the heat treatment for supply of oxygen may be performed following the heat treatment for dehydration or dehydrogenation, the heat treatment for dehydration or dehydrogenation may double as the heat treatment for supply of oxygen, or the heat treatment for supply of oxygen may double as the heat treatment for dehydration or dehydrogenation.

Next, the gate electrode 148 is formed over the gate insulating layer 146 to cover at least part of the top surface and side surface of the projecting structural body 131 (see FIG. 2E).

The gate electrode 148 can be formed using a metal material such as molybdenum, titanium, tantalum, tungsten, aluminum, copper, chromium, neodymium, or scandium or an alloy material which contains any of these materials as its main component. Further, a semiconductor film typified by a polycrystalline silicon film doped with an impurity element such as phosphorus, or a silicide film such as a nickel silicide film may be used as the gate electrode 148. The gate electrode 148 may have a single-layer structure or a stacked-layer structure.

As one layer of the gate electrode 148 in contact with the gate insulating layer 146, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film is preferably used. These films each have a work function higher than or equal to 5.0 eV, preferably higher than or equal to 5.5 eV, and the use of any of these films as the gate electrode makes the threshold voltage of the electric characteristics of the transistor positive; thus, a so-called normally off switching element can be obtained.

Through the aforementioned manner, the transistor 162 in this embodiment can be manufactured (see FIG. 2E).

Note that in FIGS. 2A to 2E, as described with reference to FIGS. 2A and 2B, the projecting structural body 129 provided on the surface of the insulating layer 130 is formed and the upper end corner portion 132 where the top surface and the side surface of the projecting structural body 129 intersect with each other is subjected to the R processing through the plasma treatment, whereby the projecting structural body 131 provided with the upper end corner portion 132 which is curved is formed; however, this embodiment is not limited thereto. A method for forming the projecting structural body 131, which is different from the plasma treatment, will be described below with reference to FIGS. 3A to 3C and FIGS. 4A to 4C.

Figure 3A:
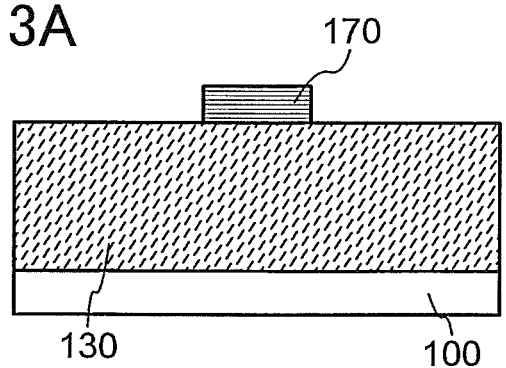
FIGS. 3A to 3C are cross-sectional views illustrating steps for manufacturing a semiconductor device according to one embodiment of the present invention.
Figure 3B:
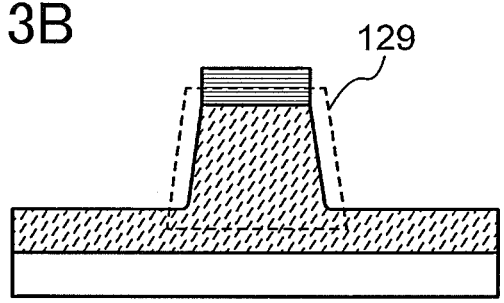
Figure 3C:
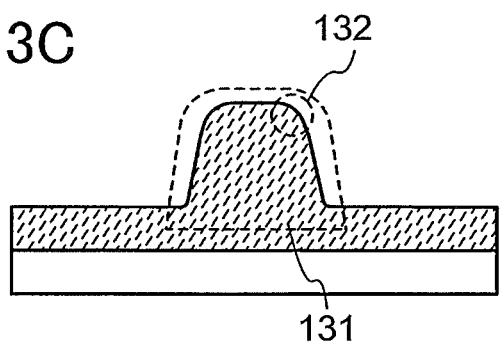

FIGS. 3A to 3C are cross-sectional views of steps for forming the insulating layer 130 provided with the projecting structural body 131 on its surface with the use of a metal mask 170. First, the insulating layer 130 is formed over the substrate 100 and the metal mask 170 is formed over the surface of the insulating layer 130 (see FIG. 3A).

The metal mask 170 can be formed in such a manner that a metal layer is formed over the insulating layer 130 and the metal layer is etched with the use of a resist mask which is selectively patterned through photolithography or the like.

Here, the metal mask 170 is formed using a metal material. For example, an element selected from aluminum, chromium, tantalum, titanium, molybdenum, and tungsten; an alloy containing any of the above elements as a main component; an alloy film containing a combination of the above elements; or the like can be used. Further, one or more materials selected from manganese, magnesium, zirconium, beryllium, and thorium may be used. In this embodiment, the metal mask 170 formed using tungsten is used.

Note that for the details of the substrate 100 and the insulating layer 130, description of FIG. 2A can be referred to.

Next, the insulating layer 130 is etched with the use of the metal mask 170, so that the projecting structural body 129 provided on the surface of the insulating layer 130 is formed (see FIG. 3B).

Dry etching is preferably used as a method for etching the insulating layer 130 in view of miniaturization, as in FIG. 2A. An etching gas and etching conditions can be set as appropriate depending on the material or the like of the insulating layer 130. A fluorocarbon-based gas or a mixed gas containing a fluorocarbon-based gas is preferably used. For example, a mixed gas of $CHF_3$ and He, a mixed gas of $CHF_3$, $CH_4$, and He, a mixed gas of $CF_4$ and $H_2$, a mixed gas of $C_4F_8$ and Ar, a mixed gas of $CHF_3$, $CF_4$, and Ar, or the like can be used. In this embodiment, a mixed gas of $CHF_3$, $CH_4$, and He is used as the etching gas. The etching conditions can be set as appropriate. For example, etching can be performed once or plural times to form the projecting structural body 129.

Note that in FIG. 3B, the projecting structural body 129 is formed to have a tapered cross section, and a portion in which the side surface of the projecting structural body 129 is in contact with a surface of a region in the insulating layer 130, where the projecting structural body 129 is not formed, is curved. With the projecting structural body 129 having such a shape, coverage with the oxide semiconductor layer formed over the projecting structural body can be improved. Note that the semiconductor device described in this embodiment is not limited thereto. As illustrated in FIG. 2B, the side surface of the projecting structural body 129 may be formed to be substantially perpendicular to the surface of the substrate 100; or the side surface of the projecting structural body 129 may be in contact with the surface of the region in the insulating layer 130, where the projecting structural body 129 is not formed, to form a substantially right angle.

Next, the metal mask 170 is removed by dry etching with the use of a reactive gas (see FIG. 3C). Here, as the reactive gas, a fluorine-based gas, a chlorine-based gas, a mixed gas of these, or the like can be used. For example, in the case of using tungsten for the metal mask 170, a mixed gas of $CF_4$, $Cl_2$, and $O_2$, or the like may be used.

The insulating layer 130 can also be etched with a fluorine-based gas or a chlorine-based gas used for the dry etching. Further, in the dry etching, the etching rate of the metal mask 170 is greater than that of the insulating layer 130. Thus, when the metal mask 170 is etched, the upper end corner portion 132, where the top surface and the side surface of the projecting structural body 129 intersect with each other, is subjected to R processing, whereby the projecting structural body 131 provided with the upper end corner portion 132 which is curved can be formed. Here, the curved surface of the upper end corner portion 132 preferably has a radius of curvature greater than or equal to 20 nm and less than or equal to 60 nm. Note that plasma treatment may be performed in addition to the etching as described with reference to FIG. 2B.

In such a manner, the insulating layer 130 provided with the projecting structural body 131 on its surface can be formed. The steps illustrated in FIGS. 2C to 2E are performed as the subsequent steps, whereby the transistor 162 can be manufactured.

Figure 4A:
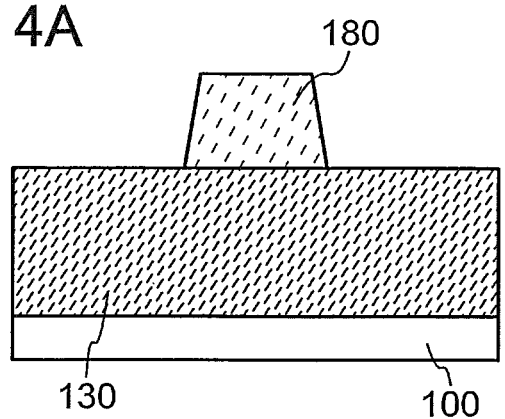
FIGS. 4A to 4C are cross-sectional views illustrating steps for manufacturing a semiconductor device according to one embodiment of the present invention.
Figure 4B:
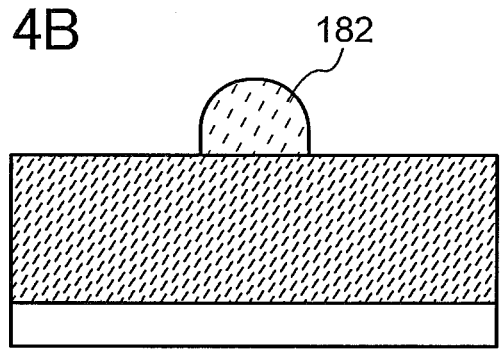
Figure 4C:
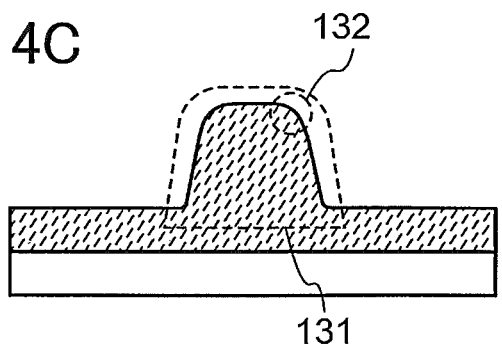

Further, FIGS. 4A to 4C are cross-sectional views of steps for forming the insulating layer 130 provided with the projecting structural body 131 on its surface with the use of a resist mask 180. First, the insulating layer 130 is formed over the substrate 100 and the resist mask 180 is formed on the surface of the insulating layer 130 (see FIG. 4A).

The resist mask 180 can be formed by selectively patterning a photosensitive resin through photolithography or the like. Here, the resist mask 180 is formed to have a tapered cross section and a side surface which forms an angle of less than 90° with the surface of the insulating layer 130.

Next, the resist mask 180 is subjected to heat treatment to form a resist mask 182 whose top and side surfaces have a curved surface and whose cross section has a substantially semicircular shape as illustrated in FIG. 4B (see FIG. 4B). Here, the shape of the resist mask 182 can be controlled by appropriately setting heating conditions such as heating temperature, heating time, and the like.

Next, the insulating layer 130 is etched with the use of the resist mask 182, so that the projecting structural body 131 provided on the surface of the insulating layer 130 is formed (see FIG. 4C).

The upper end corner portion 132 where the top surface and the side surface of the projecting structural body 129 intersect with each other is subjected to R processing, so that the projecting structural body 131 provided with the curved upper end corner portion 132 can be formed. Here, the curved surface of the upper end corner portion 132 preferably has a radius of curvature greater than or equal to 20 nm and less than or equal to 60 nm. Note that plasma treatment may be performed in addition to the etching as described with reference to FIG. 2B.

Dry etching is preferably used as an etching method, as in FIG. 2A. Etching conditions can be set as appropriate. For example, etching can be performed once or plural times to form the projecting structural body 131.

Note that in FIG. 4C, the projecting structural body 131 is formed to have a tapered cross section, and a portion in which the side surface of the projecting structural body 131 is in contact with a surface of a region in the insulating layer 130, where the projecting structural body 131 is not formed, is curved. With the projecting structural body 131 having such a shape, coverage with the oxide semiconductor layer formed over the projecting structural body can be improved. Note that the semiconductor device described in this embodiment is not limited thereto. As described in FIG. 2B, the side surface of the projecting structural body 131 may be formed to be substantially perpendicular to the surface of the substrate 100, and the side surface of the projecting structural body 131 may be in contact with a surface of the insulating layer 130, where the projecting structural body 131 is not formed, to form a substantially right angle.

In such a manner, the insulating layer 130 provided with the projecting structural body 131 on its surface can be formed. The steps illustrated in FIGS. 2C to 2E are performed as the subsequent steps, whereby the transistor 162 can be manufactured.

As described above, since the oxide semiconductor layer 144 is provided in contact with at least part of the top surface and side surface of the projecting structural body 131 in the transistor 162 of this embodiment, the effective channel length of the transistor 162 can be greater than the distance between the source electrode 142a and the drain electrode 142b (the apparent channel length of the transistor 162). Consequently, the transistor is miniaturized and the occurrence of a short-channel effect can be suppressed.

In addition, the upper end corner portion 132 of the projecting structural body 131 is curved, so that a large number of crystals each having a c-axis substantially perpendicular to the curved surface of the upper end corner portion 132 can be included in the oxide semiconductor layer 144. Provision of the oxide semiconductor layer 144 including a crystal with c-axis orientation can suppress change in the electric characteristics due to irradiation with visible light or ultraviolet light. Thus, with the oxide semiconductor layer 144, a semiconductor device with stable electric characteristics and high reliability can be provided.

The structures and methods described in this embodiment can be combined as appropriate with any of the structures and methods described in the other embodiments.

(Embodiment 2)

In this embodiment, as one embodiment of the present invention, a method for manufacturing a semiconductor device including an oxide semiconductor, which is different from that in the above embodiment will be described with reference to FIGS. 5A to 5E.

Figure 5A:
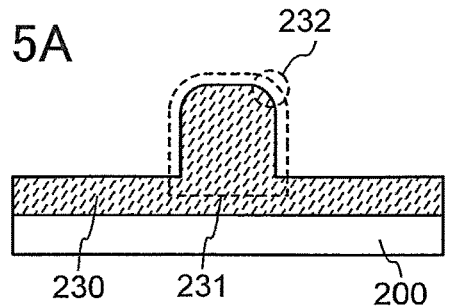
FIGS. 5A to 5E are cross-sectional views illustrating steps for manufacturing a semiconductor device according to one embodiment of the present invention.
Figure 5B:
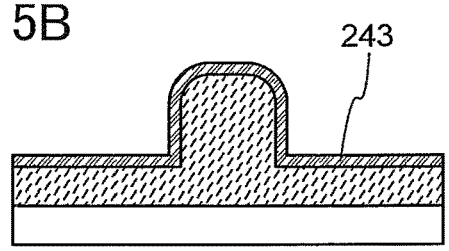
Figure 5C:
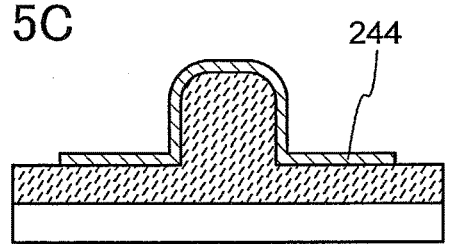
Figure 5D:
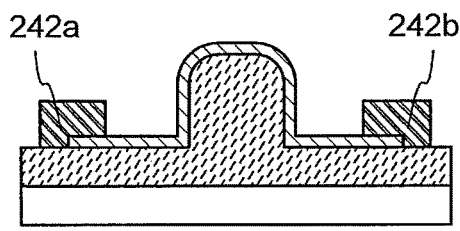
Figure 5E:
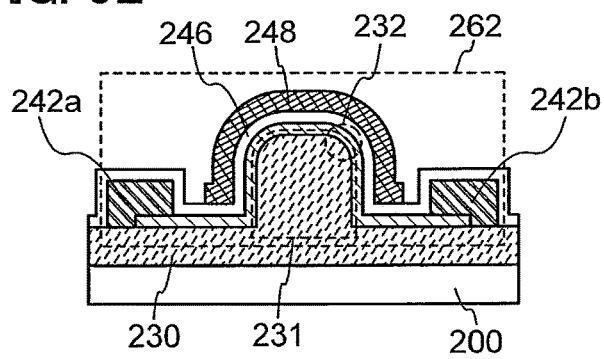

A structure of a transistor 262 illustrated in FIG. 5E is similar to that of the transistor 162 illustrated in FIG. 1B. The transistor 262 includes an insulating layer 230 formed over a substrate 200 and provided with a projecting structural body 231 on its surface, an oxide semiconductor layer 244 provided in contact with at least part of a top surface and side surface of the projecting structural body 231, a gate insulating layer 246 provided over the oxide semiconductor layer 244, a gate electrode 248 provided over the gate insulating layer 246 so as to cover at least part of the top surface and side surface of the projecting structural body 231, and a source electrode 242a and a drain electrode 242b which are electrically connected to the oxide semiconductor layer 244. In addition, the projecting structural body 231 provided on the surface of the insulating layer 230 has a curved upper end corner portion 232.

Here, the substrate 200, the insulating layer 230, the projecting structural body 231, the upper end corner portion 232, the oxide semiconductor layer 244, the gate insulating layer 246, the gate electrode 248, the source electrode 242a, and the drain electrode 242b correspond to the substrate 100, the insulating layer 130, the projecting structural body 131, the upper end corner portion 132, the oxide semiconductor layer 144, the gate insulating layer 146, the gate electrode 148, the source electrode 142a, and the drain electrode 142b, respectively, which are described in the aforementioned embodiment.

Cross-sectional views of steps for manufacturing the transistor 262, which are illustrated in FIGS. 5A to 5E, correspond to a cross-sectional view of the transistor 162, which is along a line A1-A2 in FIG. 1B.

First, as described in the above embodiment, the insulating layer 230 is formed over the substrate 200 and the projecting structural body 231 provided with the upper end corner portion 232 on its surface is formed on the surface of the insulating layer 230 (see FIG. 5A). The top surface and the side surface of the projecting structural body 231 intersect with each other in the upper end corner portion 232, and the upper end corner portion 232 is curved.

Here, for the details of the substrate 200, the insulating layer 230, and the projecting structural body 231, description in the above embodiment can be referred to.

Note that before the film formation of an oxide semiconductor, it is preferable that a treatment chamber be heated and evacuated to remove impurities, such as hydrogen, water, a hydroxyl group, and hydride, in the treatment chamber. It is particularly important to remove the impurities adsorbed on an inner wall of the treatment chamber. Here, heat treatment may be performed at temperature higher than or equal to 100° C. and lower than or equal to 450° C. Evacuation of the treatment chamber is preferably performed with a rough vacuum pump, such as a dry pump, and a high vacuum pump, such as a sputter ion pump, a turbo molecular pump, or a cryopump, in appropriate combination. The turbo molecular pump has an outstanding capability in evacuating a large-sized molecule, whereas it has a low capability in evacuating hydrogen and water. Further, combination with a cryopump having a high capability in evacuating water or a sputter ion pump having a high capability in evacuating hydrogen is effective. At this time, when the impurities are removed while an inert gas is introduced, the rate of elimination of water or the like, which is difficult to eliminate only by evacuation, can be further increased. Removal of impurities in the treatment chamber by such treatment before the film formation of the oxide semiconductor can prevent hydrogen, water, a hydroxyl group, hydride, and the like from entering the oxide semiconductor layer 244.

Next, the oxide semiconductor is deposited while the substrate 200 is heated, whereby an oxide semiconductor layer 243 is formed in contact with at least part of the top surface and side surface of the projecting structural body 231 formed on the surface of the insulating layer 230 (see FIG. 5B). Here, the substrate 200 is heated so that the substrate temperature is lower than 200° C., more preferably lower than 180° C.

When the substrate temperature is lower than 200° C., preferably lower than 180° C. at the time of the film formation, the oxide semiconductor layer 243 has an amorphous structure; therefore, the oxide semiconductor layer 243 is different from the oxide semiconductor layer 144, which becomes a CAAC-OS film at the time of the film formation, described in the above embodiment.

The oxide semiconductor layer 243 is formed to have a thickness greater than or equal to 1 nm and less than or equal to 100 nm, and a sputtering method, a molecular beam epitaxy (MBE) method, a pulse laser deposition method, an atomic layer deposition (ALD) method, or the like can be used as appropriate for forming the oxide semiconductor layer 243. The oxide semiconductor layer 244 may be formed using a sputtering apparatus which performs film formation with surfaces of a plurality of substrates set substantially perpendicular to a surface of a sputtering target, which is so called a columnar plasma (CP) sputtering system.

As a material of the oxide semiconductor layer 243, an oxide semiconductor having a band gap wider than at least silicon is used. Examples of an oxide semiconductor having a band gap wider than that of silicon include a four-component metal oxide such as an In—Sn—Ga—Zn—O-based oxide semiconductor; three-component metal oxides such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, a Sn—Al—Zn—O-based oxide semiconductor, and a Hf—In—Zn—O-based oxide semiconductor; two-component metal oxides such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, and an In—Ga—O-based oxide semiconductor; single-component metal oxides such as an In—O-based oxide semiconductor, a Sn—O-based oxide semiconductor, and a Zn—O-based oxide semiconductor; and the like. In this embodiment, an In—Ga—Zn—O-based oxide semiconductor is used.

Note that for example, an In—Ga—Zn—O-based oxide semiconductor refers to an oxide semiconductor containing indium (In), gallium (Ga), and zinc (Zn), and there is no limitation on the composition ratio thereof.

As the oxide semiconductor layer 243, a thin film expressed by a chemical formula of $InMO_3(ZnO)_m$ (m>0) can be used. Here, M represents one or more metal elements selected from Zn, Ga, Al, Mn, and Co. For example, M can be Ga, Ga and Al, Ga and Mn, Ga and Co, or the like.

When an In—Ga—Zn—O-based material is used for the oxide semiconductor, for example, an oxide target having a composition ratio of $In_2O_3:Ga_2O_3:ZnO=1:1:1$ [molar ratio] can be used as a target. Without limitation to the material and the component of the target, for example, an oxide target having a composition ratio of $In_2O_3:Ga_2O_3:ZnO=1:1:2$ [molar ratio] may be used.

In the case where an In—Sn—Zn—O-based material is used for the oxide semiconductor, the composition ratio of the target may be In:Sn:Zn=1:2:2, In:Sn:Zn=2:1:3, In:Sn:Zn=1:1:1, or the like in an atomic ratio.

In the case where an In—Zn—O-based material is used for the oxide semiconductor, a target therefor has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=15:1 to 1.5:1 in an atomic ratio ($In_2O_3$:ZnO=15:2 to 3:4 in a molar ratio). For example, in a target used for formation of an In—Zn—O-based oxide semiconductor with an atomic ratio of In:Zn:O=X:Y:Z, the relation of Z>1.5X+Y is satisfied.

Atmosphere of the film formation may be a rare gas (typically argon) atmosphere, an oxygen atmosphere, or a mixed atmosphere containing a rare gas and oxygen. Here, when the volume of oxygen is larger than the volume of a rare gas at the time of the film formation, supply of oxygen into the oxide semiconductor layer 243 can be facilitated and oxygen deficiency in the oxide semiconductor layer 243 can be reduced. In order to prevent hydrogen, water, a hydroxyl group, hydride, and the like from entering the oxide semiconductor layer 243, an atmosphere of a high-purity gas from which impurities such as hydrogen, water, a hydroxyl group, and hydride are sufficiently removed is preferable.

Here, as described in the above embodiment, heat treatment for dehydration or dehydrogenation is preferably performed on the oxide semiconductor layer. The heat treatment can remove substances including hydrogen atoms in the oxide semiconductor layer 243 and can order a structure of the oxide semiconductor layer 243, and thus defect level in energy gap can be reduced. Note that the heat treatment is preferably performed so that crystals are not formed in the oxide semiconductor layer 243 which is in the amorphous state. The heat treatment is performed in an inert gas atmosphere at temperature preferably higher than or equal to 250° C. and lower than or equal to 400° C., more preferably lower than or equal to 300° C. The inert gas atmosphere is preferably an atmosphere which contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is greater than or equal to 6 N (99.9999%), preferably greater than or equal to 7 N (99.99999%) (that is, the concentration of the impurities is less than or equal to 1 ppm, preferably less than or equal to 0.1 ppm).

The heat treatment can be performed by introducing the substrate 200 into an electric furnace using a resistance heater or the like, for example. The heat treatment apparatus is not limited to the electric furnace and may be an apparatus for heating an object to be processed by thermal conduction or thermal radiation from a medium such as a heated gas. For example, a rapid thermal annealing (RTA) apparatus such as a lamp rapid thermal annealing (LRTA) apparatus or a gas rapid thermal annealing (GRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, such as nitrogen or a rare gas such as argon is used.

In addition, it is preferable that after the oxide semiconductor layer 243 is heated through the heat treatment for dehydration or dehydrogenation, a high-purity oxygen gas, a high-purity $N_2O$ gas, or ultra-dry air (the amount of moisture is less than or equal to 20 ppm (−55° C. by conversion into a dew point), preferably less than or equal to 1 ppm, or more preferably less than or equal to 10 ppb, when measured with a dew point meter of a cavity ring down laser spectroscopy (CRDS) system) be introduced into the same furnace. It is preferable that water, hydrogen, and the like be not contained in these gases in particular. The purity of the oxygen gas or the $N_2O$ gas that is introduced into the heat treatment apparatus is preferably greater than or equal to 6N, more preferably greater than or equal to 7N (i.e., the concentration of impurities in the oxygen gas or the N₂O gas is preferably less than or equal to 1 ppm, more preferably less than or equal to 0.1 ppm). By the action of the oxygen gas or the N₂O gas, oxygen which is one of a main component of the oxide semiconductor and which has been reduced through the step for removing impurities by dehydration or dehydrogenation can be supplied. Through this step, the oxide semiconductor layer can be highly purified and made to be an i-type (intrinsic) oxide semiconductor.

The impurities are reduced by the heat treatment, leading to formation of an i-type oxide semiconductor layer (an intrinsic oxide semiconductor layer) or a substantially i-type oxide semiconductor layer. Thus, a transistor having excellent characteristics can be realized.

Note that the above heat treatment has an effect of removing hydrogen, water, and the like and can be referred to as dehydration, dehydrogenation, or the like. The heat treatment can be performed at the timing, for example, before the oxide semiconductor layer is processed to have an island shape, after the gate insulating layer is formed, or the like. The number of times of such heat treatment for dehydration or dehydrogenation is not limited to one and may be two or more.

Next, the heat treatment is performed on the amorphous oxide semiconductor layer 243 so that at least part of the oxide semiconductor layer is crystallized, whereby the oxide semiconductor layer 244 including a crystal with c-axis orientation is formed (see FIG. 5C). Here, the temperature of the heat treatment is higher than or equal to 250° C. and lower than or equal to 700° C., preferably higher than or equal to 400° C., further preferably higher than or equal to 500° C., still further preferably higher than or equal to 550° C.

When the heat treatment is performed at temperature higher than that at the time of the film formation in such a manner, the oxide semiconductor layer 243 can be crystallized. Note that for conditions of the heat treatment except for the heat treatment temperature, description of the aforementioned heat treatment for dehydration or dehydrogenation is referred to.

Note that in FIG. 5C, the oxide semiconductor layer 244 is processed to be an island shape; however, the oxide semiconductor layer 244 is not necessarily processed to be an island shape.

The oxide semiconductor layer 244 is formed in such a manner, whereby the crystalline oxide semiconductor layer 244 having c-axis orientation can be formed. Here, the oxide semiconductor layer 244 is formed over and in contact with the projecting structural body 231 provided with the upper end corner portion 232 which is curved, so that the oxide semiconductor layer 244 can include a large number of crystals each having a c-axis substantially perpendicular to the curved surface of the upper end corner portion 232. More preferably, the oxide semiconductor layer 244 includes a crystal having a continuous growth surface and metal atoms arranged in a layered manner to the curved surface of the upper end corner portion 232. Further, as described above, the surface of the insulating layer 230 including the upper end corner portion 232 has increased flatness, whereby the continuity of the growth surface of the crystal included in the oxide semiconductor layer 244 is increased, resulting in more increase in the crystallinity of the oxide semiconductor layer 244.

Provision of the oxide semiconductor layer 244 including a crystal with c-axis orientation can suppress change in the electric characteristics due to irradiation with visible light or ultraviolet light. Thus, with the oxide semiconductor layer 244, a semiconductor device with stable electric characteristics and high reliability can be provided.

Next, a conductive layer is formed over the oxide semiconductor layer 244 and the conductive layer is processed to form the source electrode 242a and the drain electrode 242b which are electrically connected to the oxide semiconductor layer 244 (see FIG. 5D).

Here, for the details of the source electrode 242a and the drain electrode 242b, description of the above embodiment can be referred to.

Next, the gate insulating layer 246 is formed over the oxide semiconductor layer 244, the source electrode 242a, and the drain electrode 242b, and the gate electrode 248 is formed over the gate insulating layer 246 so as to cover at least part of the top surface and side surface of the projecting structural body 231 (see FIG. 5E).

Here, for the details of the gate insulating layer 246 and the gate electrode 248, description of the above embodiment can be referred to.

Further, as described in the above embodiment, heat treatment for supply of oxygen may be performed in an inert gas atmosphere or an oxygen atmosphere after the film formation of the gate insulating layer 246. The heat treatment is preferably performed at temperature higher than or equal to 200° C. and lower than or equal to 450° C., and more preferably higher than or equal to 250° C. and lower than or equal to 350° C. With the heat treatment for supply of oxygen, variation in electric characteristics of the transistor can be reduced. Further, in the case where the gate insulating layer 246 in contact with the oxide semiconductor layer 244 contains oxygen, oxygen is supplied to the oxide semiconductor layer 244 to cover oxygen deficiency in the oxide semiconductor layer 244, so that an i-type (intrinsic semiconductor) or substantially i-type oxide semiconductor layer can be formed.

Note that in this embodiment, the heat treatment for supply of oxygen is performed after the gate insulating layer 246 is formed; however, the timing of the heat treatment for supply of oxygen is not limited thereto. For example, the heat treatment for supply of oxygen may be performed after the source electrode 242a and the drain electrode 242b are formed. Alternatively, the heat treatment for supply of oxygen may be performed following the heat treatment for dehydration or dehydrogenation, the heat treatment for dehydration or dehydrogenation may double as the heat treatment for supply of oxygen, or the heat treatment for supply of oxygen may double as the heat treatment for dehydration or dehydrogenation.

Through the aforementioned manner, the transistor 262 in this embodiment can be manufactured (see FIG. 5E).

As described above, since the oxide semiconductor layer 244 is provided in contact with at least part of the top surface and side surface of the projecting structural body 231 in the transistor 262 of this embodiment, the effective channel length of the transistor 262 can be greater than the distance between the source electrode 242a and the drain electrode 242b (the apparent channel length of the transistor 262). Consequently, the transistor is miniaturized and the occurrence of a short-channel effect can be suppressed.

In addition, as described above, the upper end corner portion 232 of the projecting structural body 231 is curved, so that a large number of crystals each having a c-axis substantially perpendicular to the curved surface of the upper end corner portion 232 can be included in the oxide semiconductor layer 244. Provision of the oxide semiconductor layer 244 including a crystal with c-axis orientation can suppress change in the electric characteristics due to irradiation with visible light or ultraviolet light. Thus, with the oxide semiconductor layer 244, a semiconductor device with stable electric characteristics and high reliability can be provided.

The structures and methods described in this embodiment can be combined as appropriate with any of the structures and methods described in the other embodiments.

(Embodiment 3)

In this embodiment, an example of a semiconductor device which includes the transistor 162 described in any of the above Embodiments, which can hold stored data even when not powered, and which has an unlimited number of write cycles will be described with reference to drawings. Needless to say, the transistor 262 described in the above Embodiments may be used instead of the transistor 162.

Since the off-state current of the transistor 162 is small, stored data can be held for a long time owing to such a transistor. In other words, it is possible to obtain a semiconductor device which does not require refresh operation or has an extremely low frequency of the refresh operation, which leads to a sufficient reduction in power consumption.

Figure 6A:
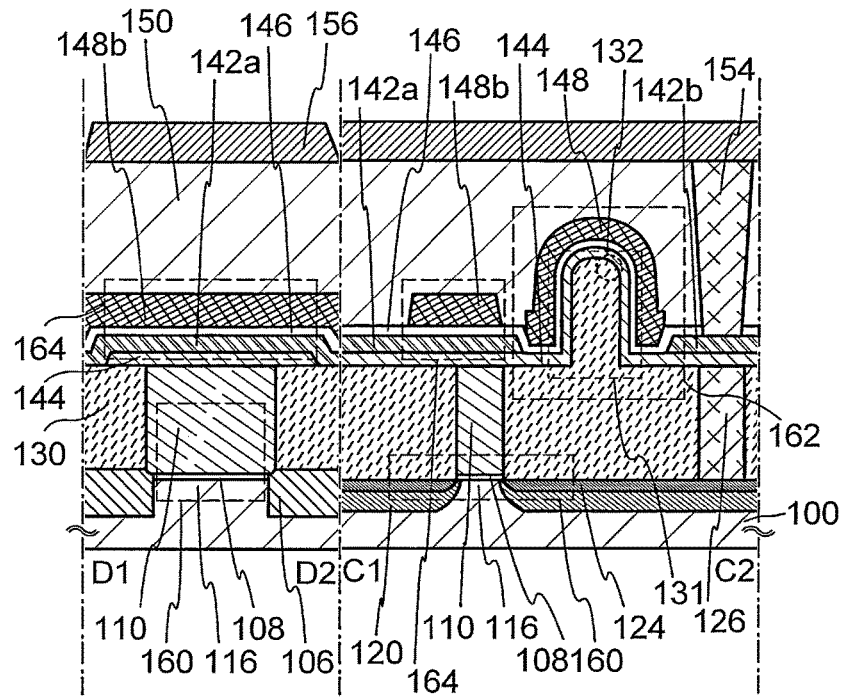
FIGS. 6A to 6C are a cross-sectional view, a plan view, and a circuit diagram each illustrating a semiconductor device according to one embodiment of the present invention.
Figure 6B:
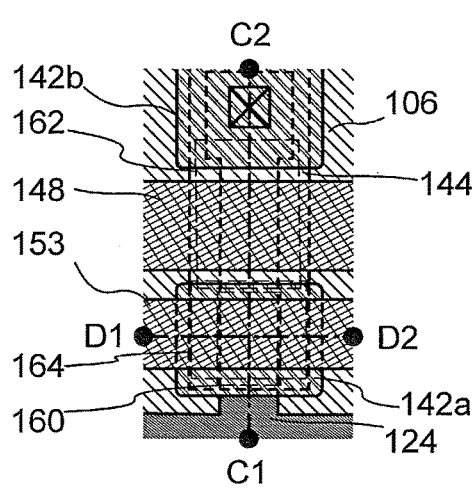
Figure 6C:
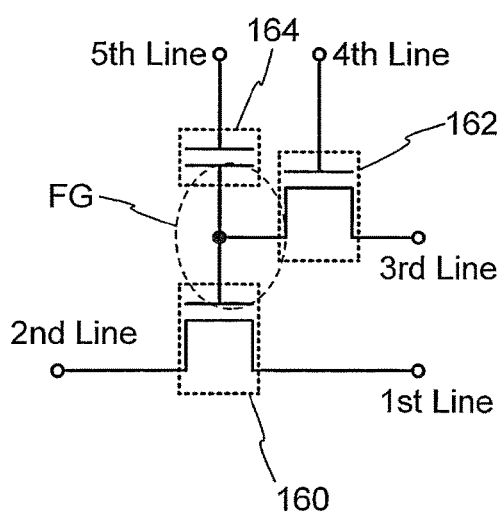

FIGS. 6A to 6C illustrate an example of a structure of the semiconductor device. FIG. 6A is a cross-sectional view of the semiconductor device, FIG. 6B is a plan view of the semiconductor device, and FIG. 6C is a circuit diagram of the semiconductor device. Here, FIG. 6A corresponds to a cross section along a line C1-C2 and line D1-D2 in FIG. 6B.

The semiconductor device illustrated in FIGS. 6A and 6B includes a transistor 160 including a first semiconductor material in a lower portion, and the transistor 162 including a second semiconductor material in an upper portion. The transistor 162 has the same structure as that described in any of the above Embodiments; thus, for description of FIGS. 6A and 6B, the same reference numerals are used for the same parts as those in FIGS. 1A and 1B.

Here, the first semiconductor material and the second semiconductor material are preferably materials having different band gaps. For example, the first semiconductor material can be a semiconductor material (such as silicon) other than an oxide semiconductor, and the second semiconductor material can be an oxide semiconductor. Since silicon or the like is used, a transistor including a material other than an oxide semiconductor can operate at high speed easily. On the other hand, a transistor including an oxide semiconductor can hold charge for a long time because of its characteristics.

Although both of the above transistors are n-channel transistors in the following description, it is needless to say that p-channel transistors can be used. The technical nature of the disclosed invention is to use a wide band gap semiconductor in the transistor 162 so that data can be held. Therefore, it is not necessary to limit a specific structure of the semiconductor device, such as a material of the semiconductor device or a structure of the semiconductor device, to the structure described here.

The transistor 160 in FIG. 6A includes a channel formation region 116 provided in the substrate 100 including a semiconductor material (such as silicon), impurity regions 120 provided such that the channel formation region 116 is sandwiched therebetween, a metal compound region 124 provided in contact with the impurity regions 120, a gate insulating layer 108 provided over the channel formation region 116, and a gate electrode 110 provided over the gate insulating layer 108.

An electrode 126 is connected to part of the metal compound region 124 of the transistor 160. Here, the electrode 126 functions as a source electrode or a drain electrode of the transistor 160. Further, an element isolation insulating layer 106 is formed on the substrate 100 so as to surround the transistor 160, and the insulating layer 130 is formed so as to cover the transistor 160. Note that for higher integration, it is preferable that, as in FIG. 6A, the transistor 160 does not have a sidewall insulating layer. On the other hand, when the characteristics of the transistor 160 have priority, the sidewall insulating layer may be formed on a side surface of the gate electrode 110 and the impurity regions 120 may include a region having a different impurity concentration.

As illustrated in FIG. 6A, the transistor 162 includes the oxide semiconductor layer 144 provided in contact with at least part of a top surface and side surface of the projecting structural body 131 provided on a surface of the insulating layer 130, the gate insulating layer 146 provided over the oxide semiconductor layer 144, the gate electrode 148 provided over the gate insulating layer 146 to cover at least part of the top surface and side surface of the projecting structural body 131, and the source electrode 142a and the drain electrode 142b which are electrically connected to the oxide semiconductor layer 144. In addition, the oxide semiconductor layer 144 is electically connected to the gate electrode 110 of the transistor 160. Here, the crystalline oxide semiconductor layer 144 is preferably a highly purified crystalline oxide semiconductor layer. With the use of a highly purified oxide semiconductor, the transistor 162 which has extremely favorable off-state characteristics can be obtained.

Further, in the insulating layer 130 provided with the projecting structural body 131 on its surface, the upper end corner portion 132 is curved, and the oxide semiconductor layer 144 includes a crystal having a c-axis substantially perpendicular to the curved surface. Provision of the oxide semiconductor layer 144 including a crystal with c-axis orientation can suppress change in the electric characteristics due to irradiation with visible light or ultraviolet light. Thus, with the oxide semiconductor layer 144, a semiconductor device with more stable electric characteristics and high reliability can be provided.

In addition, a conductive layer 148b is provided in a region over the gate insulating layer 146, which overlaps with the source electrode 142a of the transistor 162, and the source electrode 142a, the gate insulating layer 146, and the conductive layer 148b form a capacitor 164. That is, the source electrode 142a of the transistor 162 functions as one electrode of the capacitor 164, and the conductive layer 148b functions as the other electrode of the capacitor 164. Note that in the case where no capacitor is needed, a structure in which the capacitor 164 is not provided is also possible. Alternatively, the capacitor 164 may be separately provided above the transistor 162. For example, a trench-type capacitor or a stack-type capacitor may be separately formed above the transistor 162 or below the transistor 160 so as to be three-dimensionally stacked, whereby the degree of integration may be increased.

An insulating layer 150 is provided over the transistor 162 and the capacitor 164. In addition, a wiring 156 for connecting the transistor 162 to another transistor is provided over the insulating layer 150. The wiring 156 is electrically connected to the drain electrode 142b through an electrode 154 formed in an opening provided in the insulating layer 150, the gate insulating layer 146, and the like. Here, the electrode 154 is preferably provided so as to partly overlap with at least the oxide semiconductor layer 144 of the transistor 162.

In FIGS. 6A and 6B, the transistor 160 and 162 are provided so as to at least partly overlap with each other, and the source region or the drain region of the transistor 160 is preferably provided to partly overlap with the oxide semiconductor layer 144. In addition, the transistor 162 and the capacitor 164 are provided so as to overlap with at least part of the transistor 160. For example, the conductive layer 148b of the capacitor 164 is provided to at least partly overlap with the gate electrode 110 of the transistor 160. When such a planar layout is employed, the area occupied by the semiconductor device can be reduced; thus, the degree of integration can be increased.

Although the metal compound region 124, the drain electrode 142b, and the wiring 156 are connected by the electrode 126 and the electrode 154 in FIG. 6A, the disclosed invention is not limited to this structure. For example, the drain electrode 142b may be in direct contact with the metal compound region 124. Alternatively, the wiring 156 may be in direct contact with the drain electrode 142b.

Next, an example of a circuit configuration corresponding to FIGS. 6A and 6B is illustrated in FIG. 6C.

In FIG. 6C, a first wiring (1st Line) is electrically connected to the source electrode of the transistor 160. A second wiring (2nd Line) is electrically connected to the drain electrode of the transistor 160. A third wiring (3rd Line) is electrically connected to one of the source electrode and the drain electrode of the transistor 162, and a fourth wiring (4th Line) is electrically connected to the gate electrode of the transistor 162. The gate electrode of the transistor 160 and the other of the source electrode and the drain electrode of the transistor 162 are electrically connected to one electrode of the capacitor 164 (also referred to as node FG). A fifth wiring (5th Line) is electrically connected to the other electrode of the capacitor 164.

The semiconductor device in FIG. 6C utilizes an advantage that the potential of the gate electrode of the transistor 160 can be held, and thus enables writing, holding, and reading of data as described below.

Writing and holding of data will be described. First, the potential of the fourth wiring is set to a potential at which the transistor 162 is turned on, so that the transistor 162 is turned on. Thus, the potential of the third wiring is supplied to the gate electrode of the transistor 160 and to the capacitor 164. That is, predetermined charge is supplied to the gate electrode of the transistor 160 (writing). Here, one of two kinds of charges providing different potential levels (hereinafter referred to as a low-level charge and a high-level charge) is applied. Then, the potential of the fourth wiring is set to a potential at which the transistor 162 is turned off, so that the transistor 162 is turned off. Thus, the charge supplied to the gate electrode of the transistor 160 is held (holding).

Since the off-state current of the transistor 162 is extremely small, the charge of the gate electrode of the transistor 160 is held for a long time.

Next, reading of data will be described. By supplying an appropriate potential (a reading potential) to the fifth wiring while supplying a predetermined potential (a constant potential) to the first wiring, the potential of the second wiring varies depending on the amount of charge held at the gate electrode of the transistor 160. This is because in general, when the transistor 160 is an n-channel transistor, an apparent threshold voltage $V_{th\_H}$ in the case where the high-level charge is given to the gate electrode of the transistor 160 is lower than an apparent threshold voltage $V_{th\_L}$ in the case where the low-level charge is given to the gate electrode of the transistor 160. Here, an apparent threshold voltage refers to the potential of the fifth wiring which is needed to turn on the transistor 160. Thus, the potential of the fifth wiring is set to a potential $V_0$ which is intermediate between $V_{th\_H}$ and $V_{th\_L}$, whereby charge supplied to the gate electrode of the transistor 160 can be determined. For example, in the case where the high-level charge is supplied in writing, when the potential of the fifth wiring is $V_0$ ($>V_{th\_H}$), the transistor 160 is turned on. In the case where the low-level charge is supplied in writing, even when the potential of the fifth wiring is $V_0$ ($<V_{th\_L}$), the transistor 160 remains off. Therefore, the data held can be read by measuring the potential of the second wiring.

Note that in the case where memory cells are arrayed, it is necessary that data of only a desired memory cell can be read. In the case where data is not read out, a potential at which the transistor 160 is turned off regardless of the state of the gate electrode, that is, a potential lower than $V_{th\_H}$ may be supplied to the fifth wiring. Alternatively, the fifth wiring is supplied with a potential at which the transistor 160 is turned on regardless of the state of the gate electrode, that is, a potential higher than $V_{th\_L}$.

When a transistor having a channel formation region formed using an oxide semiconductor and having extremely small off-state current is applied to the semiconductor device in this embodiment, the semiconductor device can store data for an extremely long period. In other words, refresh operation becomes unnecessary or the frequency of the refresh operation can be extremely lowered, which leads to a sufficient reduction in power consumption. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional nonvolatile memory, it is not necessary to inject and extract electrons into and from a floating gate, and thus a problem such as deterioration of a gate insulating layer does not arise at all. That is, the semiconductor device according to the disclosed invention does not have a limitation on the number of times data can be rewritten, which is a problem of a conventional nonvolatile memory, and the reliability thereof is drastically improved. Furthermore, since data is written by turning on or off the transistors, high-speed operation can be easily realized.

Since the oxide semiconductor layer 144 is provided in contact with at least part of the top surface and side surface of the projecting structural body 131 in the transistor 162 described in this embodiment, the effective channel length of the transistor 162 can be great. Consequently, the occurrence of a short-channel effect can be suppressed and the transistor is miniaturized. Thus, high integration of the semiconductor device described in this embodiment can be achieved.

In addition, the upper end corner portion 132 of the projecting structural body 131 is curved, so that a large number of crystals each having a c-axis substantially perpendicular to the curved surface of the upper end corner portion 132 can be included in the oxide semiconductor layer 144. Provision of the oxide semiconductor layer 144 including a crystal with c-axis orientation can suppress change in the electric characteristics due to irradiation with visible light or ultraviolet light. Thus, with the oxide semiconductor layer 144, a semiconductor device with stable electric characteristics and high reliability can be provided.

The structure, method, and the like described in this embodiment can be combined as appropriate with any of the structures, methods, and the like described in the other embodiments.

(Embodiment 4)

In this embodiment, a semiconductor device which includes the transistor 162 described in any of the above Embodiments, which can hold stored data even when not powered, which has an unlimited number of write cycles, and which has a structure different from the structure described in the above Embodiment will be described with reference to FIGS. 7A and 7B and FIGS. 8A and 8B. Needless to say, the transistor 262 described in the above Embodiment may be used instead of the transistor 162.

Figure 7A:
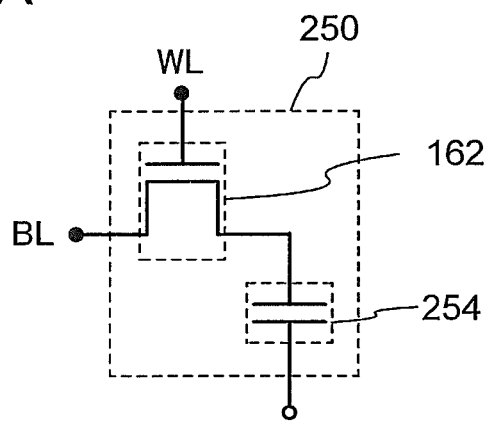
FIGS. 7A and 7B are a circuit diagram and a perspective view illustrating a semiconductor device according to one embodiment of the present invention.
Figure 7B:
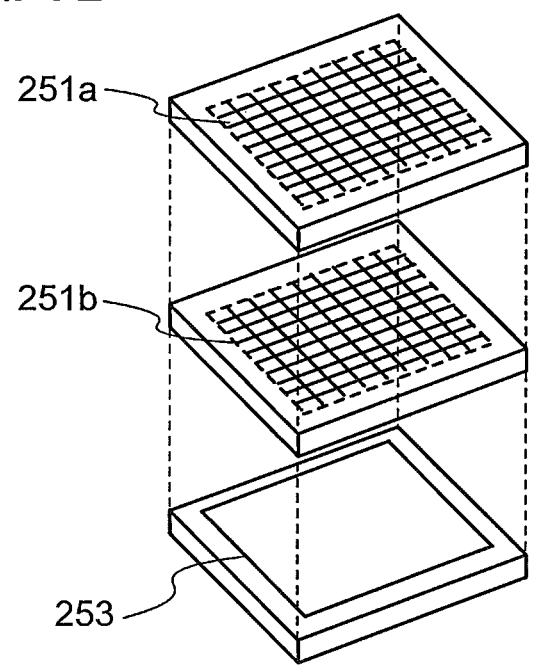

FIG. 7A illustrates an example of a circuit configuration of a semiconductor device, and FIG. 7B is a conceptual diagram illustrating an example of a semiconductor device. First, the semiconductor device illustrated in FIG. 7A will be described, and then, the semiconductor device illustrated in FIG. 7B will be described.

In the semiconductor device illustrated in FIG. 7A, a bit line BL is electrically connected to the source electrode or the drain electrode of the transistor 162, a word line WL is electrically connected to the gate electrode of the transistor 162, and the source electrode or the drain electrode of the transistor 162 is electrically connected to a first terminal of a capacitor 254.

The transistor 162 including an oxide semiconductor has a characteristic of a significantly small off-state current. For that reason, a potential of the first terminal of the capacitor 254 (or a charge accumulated in the capacitor 254) can be held for an extremely long period by turning off the transistor 162.

Next, writing and holding of data in the semiconductor device (a memory cell 250) illustrated in FIG. 7A will be described.

First, the potential of the word line WL is set to a potential at which the transistor 162 is turned on, so that the transistor 162 is turned on. Thus, the potential of the bit line BL is supplied to the first terminal of the capacitor 254 (writing). Then, the potential of the word line WL is set to a potential at which the transistor 162 is turned off, so that the transistor 162 is turned off, whereby the charge at the first terminal of the capacitor 254 is held (holding).

Since the off-state current of the transistor 162 is extremely small, the potential of the first terminal of the capacitor 254 (or the charge accumulated in the capacitor) can be held for a long time.

Next, reading of data will be described. When the transistor 162 is turned on, the bit line BL which is in a floating state and the capacitor 254 are electrically connected to each other, and the charge is redistributed between the bit line BL and the capacitor 254. Consequently, the potential of the bit line BL is changed. The amount of change in potential of the bit line BL varies depending on the potential of the first terminal of the capacitor 254 (or the charge accumulated in the capacitor 254).

For example, the potential of the bit line BL after charge redistribution is $(C_B \times V_{B0} + C \times V)/(C_B + C)$, where V is the potential of the first terminal of the capacitor 254, C is the capacitance of the capacitor 254, $C_B$ is the capacitance of the bit line BL (hereinafter also referred to as bit line capacitance), and $V_{B0}$ is the potential of the bit line BL before the charge redistribution. Therefore, it can be found that assuming that the memory cell 250 is in either of two states in which the potentials of the first terminal of the capacitor 254 are $V_1$ and $V_0$ ($V_1 > V_0$), the potential of the bit line BL in the case of holding the potential $V_1$ ($=(C_B \times V_{B0} + C \times V_1)/(C_B + C)$) is higher than the potential of the bit line BL in the case of holding the potential $V_0$ ($=(C_B \times V_{B0} + C \times V_0)/(C_B + C)$).

Then, data can be read by comparing the potential of the bit line BL with a predetermined potential.

As described above, the semiconductor device illustrated in FIG. 7A can hold charge that is accumulated in the capacitor 254 for a long time because the off-state current of the transistor 162 is extremely small. In other words, refresh operation becomes unnecessary or the frequency of the refresh operation can be extremely lowered, which leads to a sufficient reduction in power consumption. Moreover, stored data can be held for a long period even when power is not supplied.

Next, the semiconductor device illustrated in FIG. 7B will be described.

The semiconductor device illustrated in FIG. 7B includes memory cell arrays 251a and 251b each including a plurality of memory cells 250 illustrated in FIG. 7A as memory circuits in the upper portion, and a peripheral circuit 253 in the lower portion which is necessary for operating the memory cell arrays (the memory cell arrays 251a and 251b). Note that the peripheral circuit 253 is electrically connected to the memory cell arrays.

In the structure illustrated in FIG. 7B, the peripheral circuit 253 can be provided directly under the memory cell arrays (the memory cell arrays 251a and 251b). Thus, the size of the semiconductor device can be decreased.

A transistor provided in the peripheral circuit 253 is preferably formed using a semiconductor material which is different from that of the transistor 162. For example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at sufficiently high speed. Therefore, the transistor can favorably realize a variety of circuits (e.g., a logic circuit or a driver circuit) which needs to operate at high speed.

Note that FIG. 7B illustrates, as an example, the semiconductor device in which two memory cell arrays (the memory cell array 251a and the memory cell array 251b) are stacked; however, the number of memory cell arrays to be stacked is not limited thereto. Three or more memory cell arrays may be stacked.

Next, a specific structure of the memory cell 250 illustrated in FIG. 7A will be described with reference to FIGS. 8A and 8B.

Figure 8A:
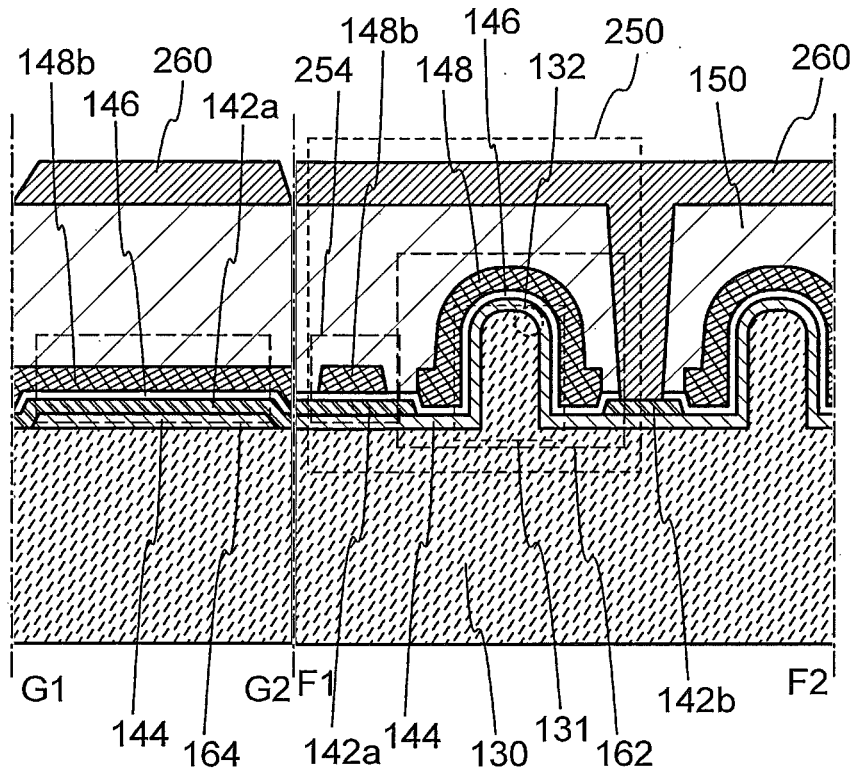
FIGS. 8A and 8B are a cross-sectional view and a plan view illustrating a semiconductor device according to one embodiment of the present invention.
Figure 8B:
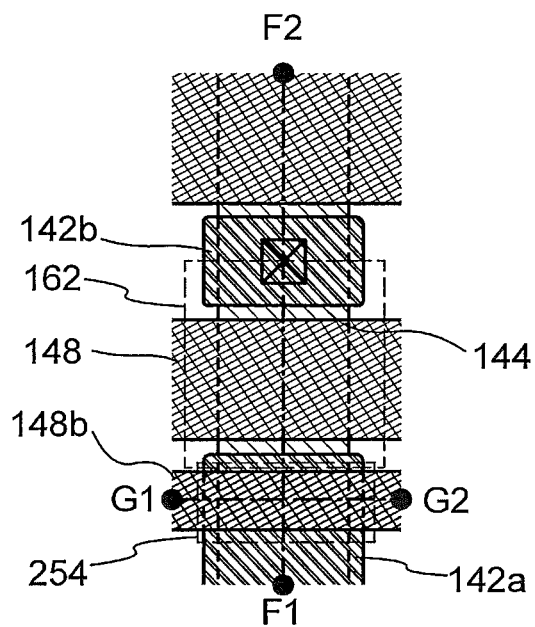

FIGS. 8A and 8B illustrate an example of a structure of the memory cell 250. FIG. 8A is a cross-sectional view of the memory cell 250, and FIG. 8B is a plan view of the memory cell 250. Here, FIG. 8A illustrates a cross section taken along a line F1-F2 and a line G1-G2 in FIG. 8B.

The transistor 162 illustrated in FIGS. 8A and 8B has the same structure as that described in any of the above Embodiments; thus, for description of FIGS. 8A and 8B, the same reference numerals are used for the same parts as those in FIGS. 1A and 1B.

As illustrated in FIG. 8A, the transistor 162 includes the oxide semiconductor layer 144 provided in contact with at least part of a top surface and side surface of the projecting structural body 131 provided on a surface of the insulating layer 130, the gate insulating layer 146 provided over the oxide semiconductor layer 144, the gate electrode 148 provided over the gate insulating layer 146 to cover at least part of the top surface and side surface of the projecting structural body 131, and the source electrode 142a and the drain electrode 142b which are electrically connected to the oxide semiconductor layer 144. Here, the crystalline oxide semiconductor layer 144 is preferably a highly purified crystalline oxide semiconductor layer. With the use of a highly purified oxide semiconductor, the transistor 162 which has extremely favorable off-state characteristics can be obtained.

Further, in the insulating layer 130 provided with the projecting structural body 131 on its surface, the upper end corner portion 132 is curved, and the oxide semiconductor layer 144 includes a crystal having a c-axis substantially perpendicular to the curved surface. Provision of the oxide semiconductor layer 144 including a crystal with c-axis orientation can suppress change in the electric characteristics due to irradiation with visible light or ultraviolet light. Thus, with the oxide semiconductor layer 144, a semiconductor device with more stable electric characteristics and high reliability can be provided.

In addition, a conductive layer 148b is provided in a region over the gate insulating layer 146, which overlaps with the source electrode 142a of the transistor 162, and the source electrode 142a, the gate insulating layer 146, and the conductive layer 148b form the capacitor 254. That is, the source electrode 142a of the transistor 162 functions as one electrode of the capacitor 254, and the conductive layer 148b functions as the other electrode of the capacitor 254.

An insulating layer 150 is provided over the transistor 162 and the capacitor 254. In addition, a wiring 260 for connecting the memory cell 250 to an adjacent memory cell 250 is provided over the insulating layer 150. The wiring 260 is electrically connected to the drain electrode 142b of the transistor 162 through an opening provided in the gate insulating layer 146, the insulating layer 150, and the like. The wiring 260 may be electrically connected to the drain electrode 142b through another conductive layer provided in the opening. Note that the wiring 260 corresponds to the bit line BL in the circuit diagram of FIG. 7A.

In FIGS. 8A and 8B, the drain electrode 142b of the transistor 162 can also function as a source electrode of a transistor included in an adjacent memory cell. When such a planar layout is employed, the area occupied by the semiconductor device can be reduced; thus, the degree of integration can be increased.

As described above, the plurality of memory cells is formed in the upper portion with the transistors including an oxide semiconductor. Since the off-state current of the transistor including an oxide semiconductor is small, stored data can be held for a long time owing to such a transistor. In other words, the frequency of the refresh operation can be extremely lowered, which leads to a sufficient reduction in power consumption.

A semiconductor device having a novel feature can be obtained by being provided with both a peripheral circuit including the transistor including a material other than an oxide semiconductor (in other words, a transistor capable of operating at sufficiently high speed) and a memory circuit including the transistor including an oxide semiconductor (in a broader sense, a transistor whose off-state current is sufficiently small). In addition, with a structure in which the peripheral circuit and the memory circuit are stacked, the degree of integration of the semiconductor device can be increased.

Since the oxide semiconductor layer 144 is provided in contact with at least part of the top surface and side surface of the projecting structural body 131 in the transistor 162 described in this embodiment, the effective channel length of the transistor 162 can be great. Consequently, the transistor is miniaturized and the occurrence of a short-channel effect can be suppressed. Thus, high integration of the semiconductor device described in this embodiment can be achieved.

In addition, the upper end corner portion 132 of the projecting structural body 131 is curved, so that a large number of crystals each having a c-axis substantially perpendicular to the curved surface of the upper end corner portion 132 can be included in the oxide semiconductor layer 144. Provision of the oxide semiconductor layer 144 including a crystal with c-axis orientation can suppress change in the electric characteristics due to irradiation with visible light or ultraviolet light. Thus, with the oxide semiconductor layer 144, a semiconductor device with stable electric characteristics and high reliability can be provided.

This embodiment can be implemented in appropriate combinations with any of the structure described in the other embodiments.

(Embodiment 5)

In this embodiment, examples of application of the semiconductor device described in any of the above embodiments to portable devices such as cellular phones, smart-phones, or electronic books will be described with reference to FIGS. 9A and 9B, FIG. 10, FIG. 11, and FIG. 12.

In a portable device such as a cellular phone, a smart-phone, or an electronic book, an SRAM or a DRAM is used to store image data temporarily. The reason why an SRAM or a DRAM is used is that a flash memory is slow in responding and is not suitable for image processing. On the other hand, an SRAM or a DRAM has the following characteristics when used for temporary storage of image data.

Figure 9A:
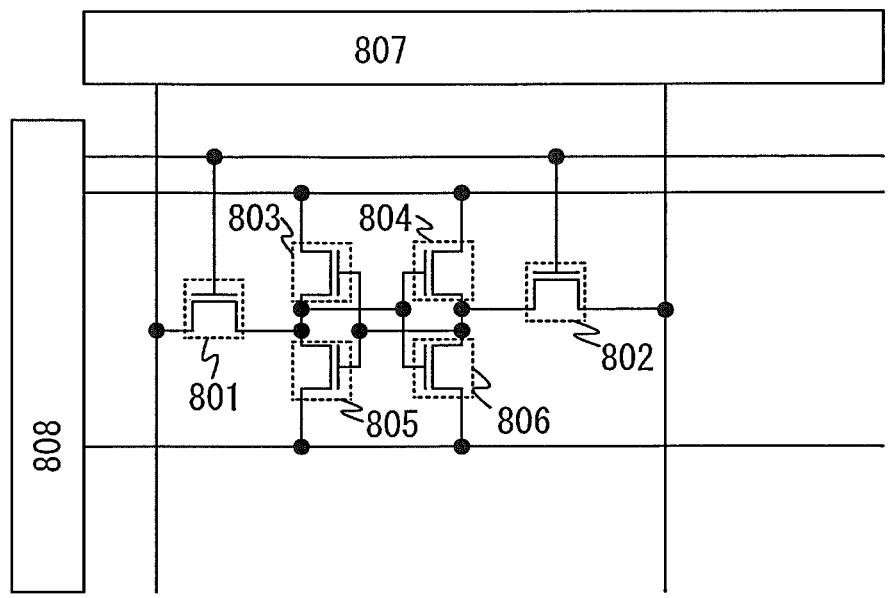
FIGS. 9A and 9B are circuit diagrams each illustrating a semiconductor device according to one embodiment of the present invention.

In an ordinary SRAM, as illustrated in FIG. 9A, one memory cell includes six transistors, that is, transistors 801 to 806, which are driven with an X decoder 807 and a Y decoder 808. The transistor 803 and the transistor 805, and the transistor 804 and the transistor 806 form inverters, which enables high-speed driving. However, because one memory cell includes six transistors, a large cell area is one disadvantage. Provided that the minimum feature size of a design rule is F, the area of a memory cell in an SRAM is generally 100 $F^2$ to 150 $F^2$. Therefore, the price per bit of an SRAM is the most expensive among memory devices.

Figure 9B:
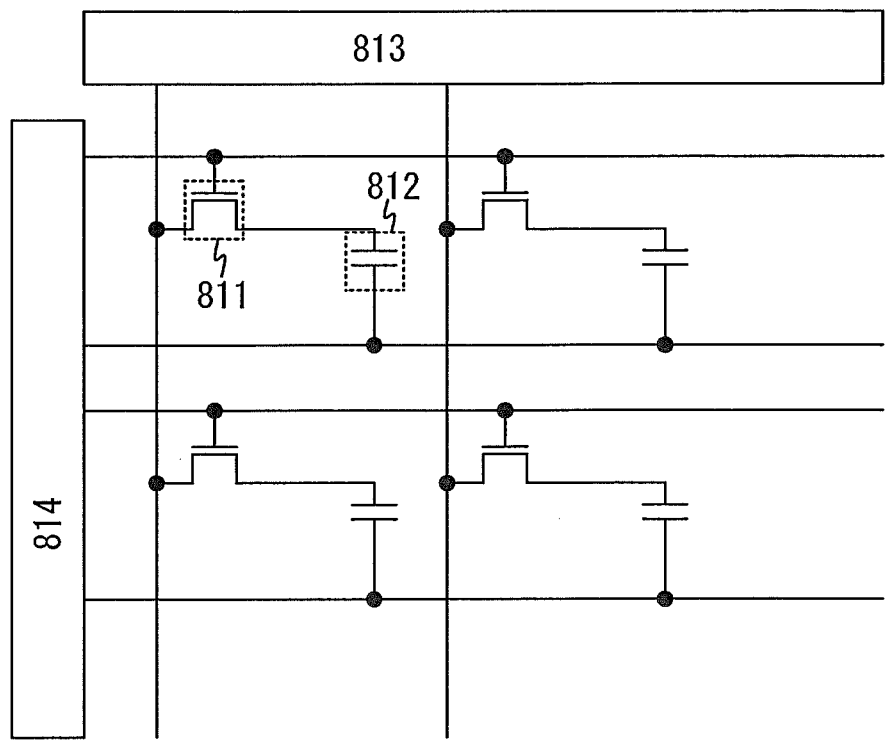

In a DRAM, as illustrated in FIG. 9B, a memory cell includes a transistor 811 and a storage capacitor 812, which are driven with an X decoder 813 and a Y decoder 814. One cell is configured with one transistor and one capacitor and has a small area. The area of a memory cell in a DRAM is generally less than or equal to 10 $F^2$. Note that the DRAM needs to be refreshed periodically and consumes electric power even when a rewriting operation is not performed.

On the other hand, the memory cell of the semiconductor device described in any of the above embodiments has an area of approximately 10 $F^2$ and does not need to be refreshed frequently. Therefore, the area of a memory cell can be decreased, and power consumption can be reduced.

Figure 10:
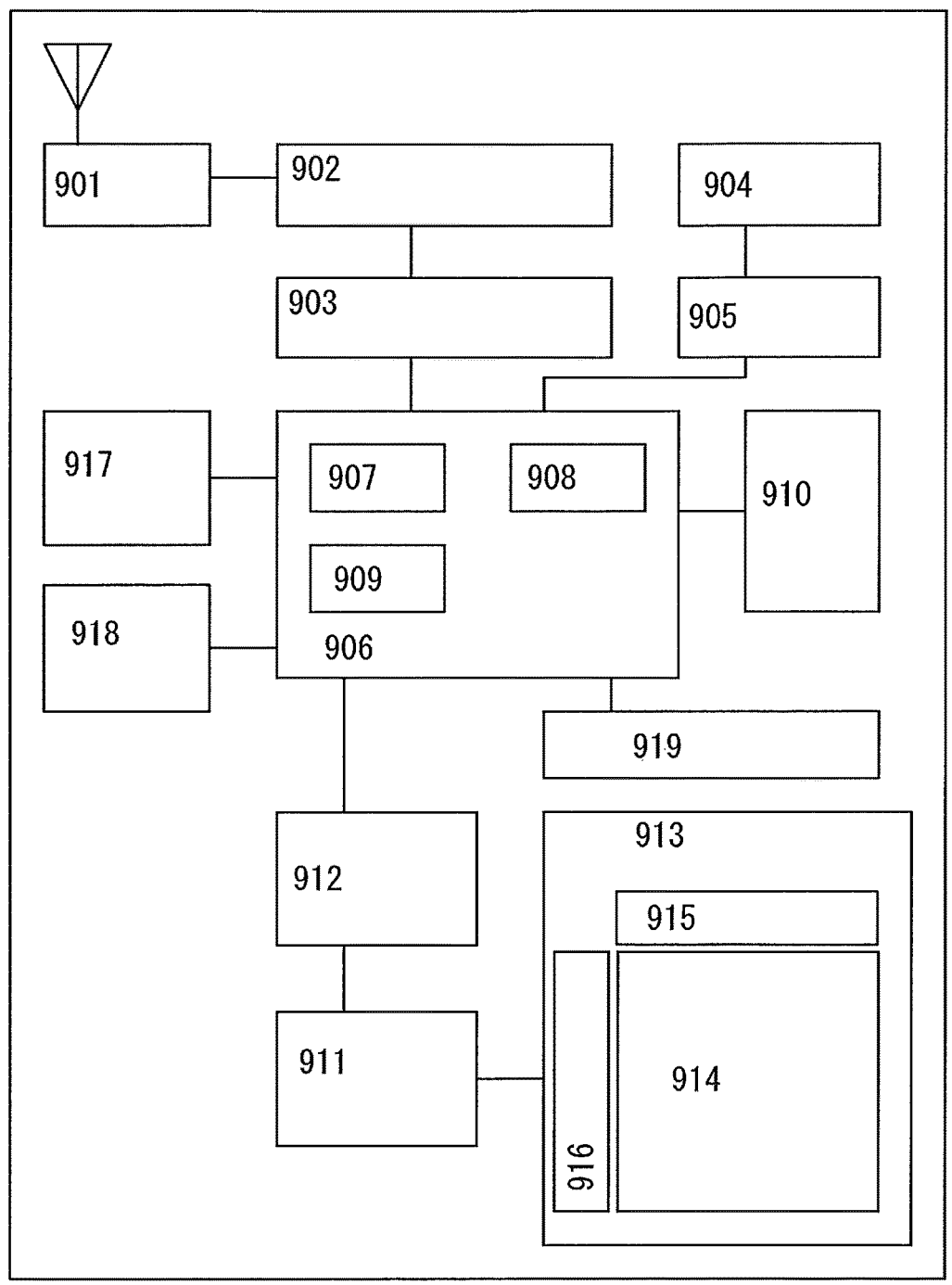
FIG. 10 is a block diagram illustrating a semiconductor device according to one embodiment of the present invention.

Next, FIG. 10 is a block diagram of a portable device. The portable device illustrated in FIG. 10 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an interface (IF) 909. In general, the memory circuit 912 includes an SRAM or a DRAM. By employing the semiconductor device described in any of the above embodiments for that portion, data can be written and read at high speed and can be held for a long time, and power consumption can be sufficiently reduced.

Figure 11:
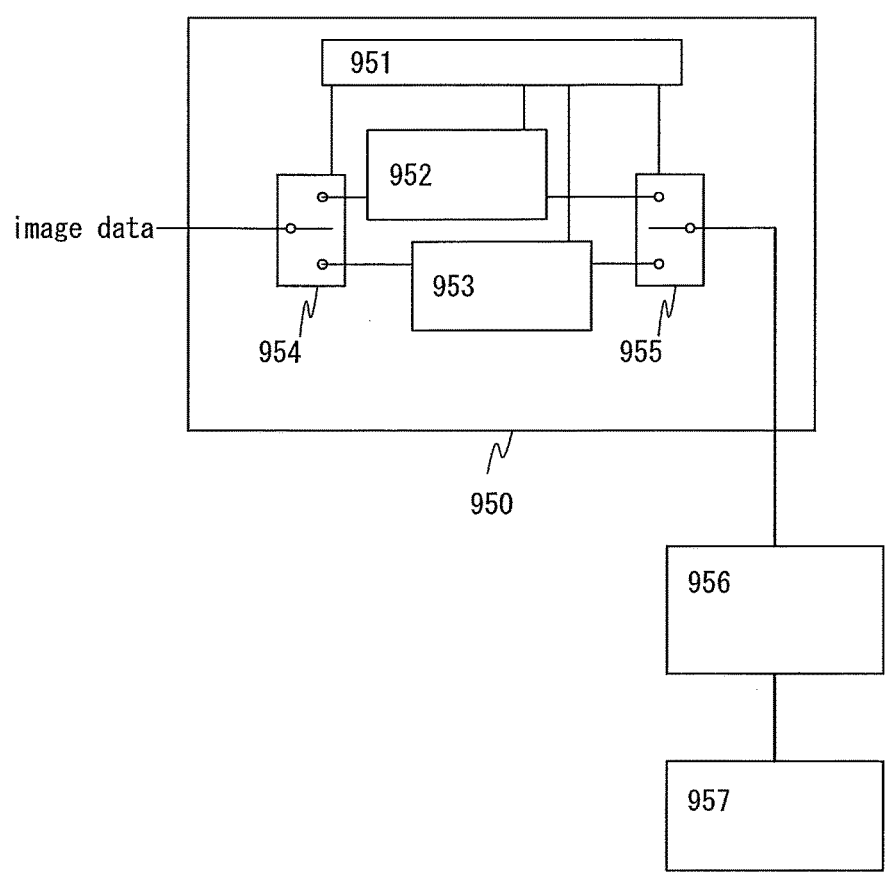
FIG. 11 is a block diagram illustrating a semiconductor device according to one embodiment of the present invention.

FIG. 11 illustrates an example of using the semiconductor device described in any of the above embodiments in a memory circuit 950 for a display. The memory circuit 950 illustrated in FIG. 11 includes a memory 952, a memory 953, a switch 954, a switch 955, and a memory controller 951. The memory circuit 950 is connected to a signal line to which image data (input image data) is input, a display controller 956 that reads and controls image data stored in the memory 952 and the memory 953 (stored image data), and a display 957 that displays an image based on a signal input from the display controller 956.

First, image data (input image data A) is produced by an application processor (not shown). The input image data A is stored in the memory 952 through the switch 954. Then, the image data stored in the memory 952 (stored image data A) is transmitted to the display 957 through the switch 955 and the display controller 956, and is displayed on the display 957.

When the input image data A remains unchanged, the stored image data A is read from the memory 952 through the switch 955 by the display controller 956 normally at a frequency of approximately 30 Hz to 60 Hz.

Next, for example, when a user carries out an operation to rewrite a screen (i.e., when the input image data A is changed), the application processor produces new image data (input image data B). The input image data B is stored in the memory 953 through the switch 954. Also during that time, the stored image data A is regularly read from the memory 952 through the switch 955. After the completion of storing the new image data (the stored image data B) in the memory 953, from the next frame for the display 957, the stored image data B starts to be read, transmitted to the display 957 through the switch 955 and the display controller 956, and displayed on the display 957. This reading operation continues until the next new image data is stored in the memory 952.

By alternately writing and reading image data to and from the memory 952 and the memory 953 as described above, images are displayed on the display 957. Note that the memory 952 and the memory 953 are not limited to separate memories, and a single memory may be divided and used. By employing the semiconductor device described in any of the above embodiments for the memory 952 and the memory 953, data can be written and read at high speed and held for a long time, and power consumption can be sufficiently reduced.

Figure 12:
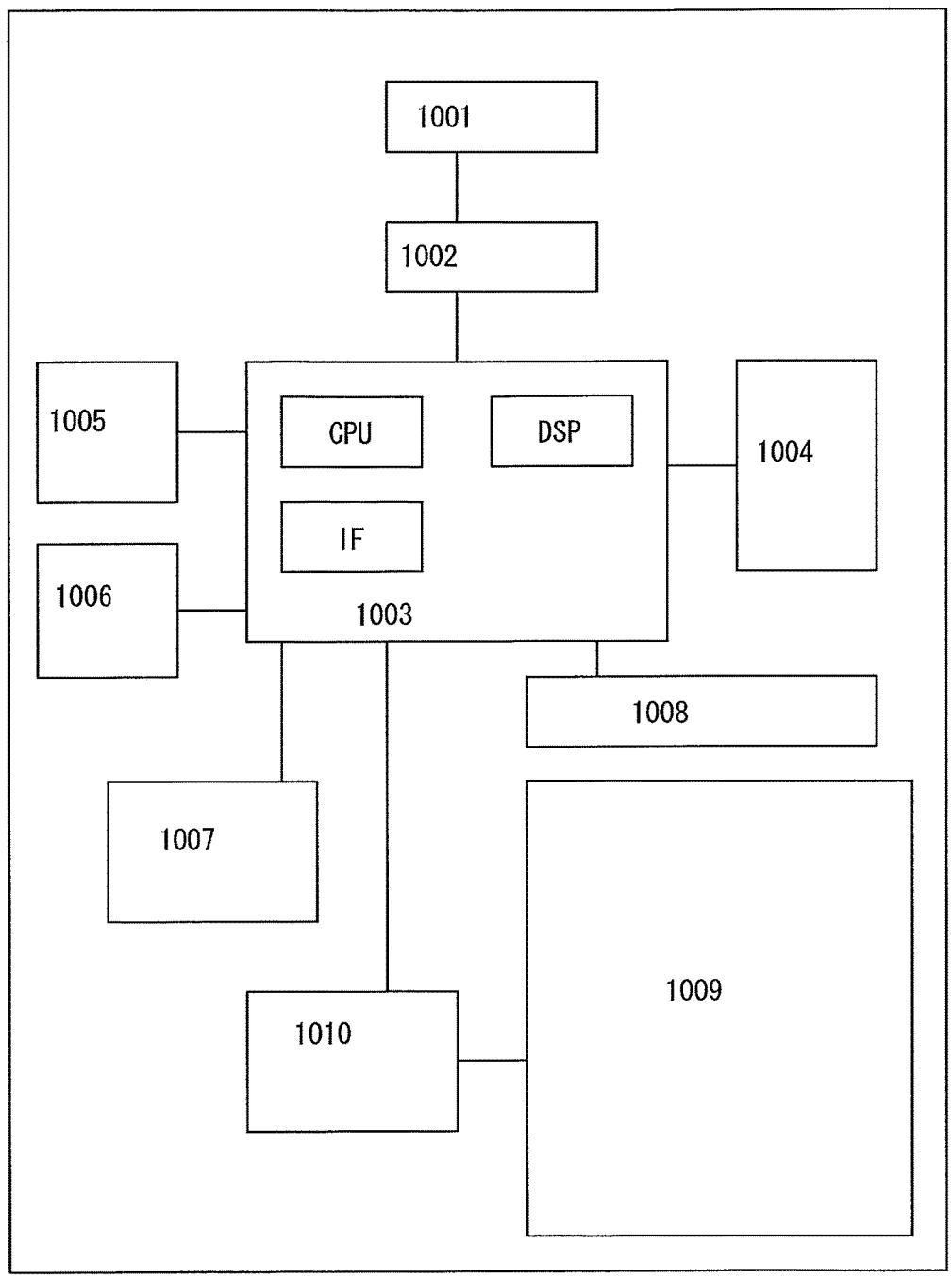
FIG. 12 is a block diagram illustrating a semiconductor device according to one embodiment of the present invention.

FIG. 12 is a block diagram of an electronic book. FIG. 12 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, the semiconductor device described in any of the above embodiments can be used for the memory circuit 1007 in FIG. 12. The memory circuit 1007 has a function of temporarily storing the contents of a book. For example, users use a highlight function in some cases. When users read an electric book, they sometimes want to mark a specified place. This marking refers to a highlight function, and users can make difference from other places by, for example, changing the color of a letter displayed, underlining a word, making a letter bold, or changing the font type of a letter. That is, there is a function of storing and holding information of a place specified by users. In order to store the data for a long time, the data may be copied to the flash memory 1004. Also in such a case, by employing the semiconductor device described in any of the above embodiments, data can be written and read at high speed and held for a long time, and power consumption can be sufficiently reduced.

As described above, the portable devices described in this embodiment each incorporate the semiconductor device according to any of the above embodiments. Therefore, it is possible to obtain a portable device which is capable of reading data at high speed, holding data for a long time, and reducing power consumption.

The structure, methods, and the like described in this embodiment can be combined as appropriate with any of the structures, methods, and the like described in the other embodiments.

EXAMPLE 1

In this example, a sample, in which an insulating layer provided with a projecting structural body on its surface was formed and an oxide semiconductor layer was formed to cover a top surface and a side surface of the projecting structural body, was manufactured and a crystalline state of the oxide semiconductor layer was observed.

Steps for manufacturing an example sample 1 which was used as a sample in this example will be described below.

First, in the example sample 1, a silicon oxide film having a thickness of 500 nm was formed as the insulating layer over a silicon substrate by a sputtering method.

The silicon oxide film was formed using a silicon oxide ($SiO_2$) target as a target under the conditions where the distance between the silicon substrate and the target was 60 mm, the pressure was 0.4 Pa, the power of the power source was 2 kW, the atmosphere was an argon and oxygen atmosphere (the argon flow rate was 25 sccm, and the oxygen flow rate was 25 sccm), and the substrate temperature was 100° C.

A resist mask was formed over the silicon oxide film through a photolithography process, and the silicon oxide film was etched using the resist mask so that a projecting structural body was provided on a surface of the silicon oxide film. The etching step was performed using an inductively coupled plasma (ICP) etching method under the conditions where the etching gas was trifluoromethane ($CHF_3$), helium (He), and methane ($CH_4$) ($CHF_3$:He:$CH_4$=22.5 sccm:127.5 sccm:5 sccm), the power of the power source was 475 W, the bias power was 300 W, the pressure was 3.0 Pa, and the substrate temperature was 70° C. In a cross section of the projecting structural body, the length of the side surface and the length of the top surface were about 350 nm.

Then, the resist mask was removed from the silicon oxide film with the use of a resist stripper.

Next, the silicon oxide film provided with the projecting structural body was subjected to plasma treatment using argon, so that an upper end corner portion, where a top surface and a side surface of the projecting structural body intersect with each other, was processed to have a curved surface whose radius of curvature is greater than or equal to 20 nm and less than or equal to 60 nm.

In this example, with an inductively coupled plasma (ICP) device, the plasma treatment was performed on the silicon oxide film provided with the projecting structural body on its surface under the conditions where argon (Ar=100 sccm) was used as a gas, the power of the power source was 500 W, the bias power was 100 W, the pressure was 1.35 Pa, the substrate temperature was −10° C., and the treatment time was 180 seconds.

Through the above steps, the silicon oxide film provided with the projecting structural body including the curved upper end corner portion having a radius of curvature greater than or equal to 20 nm and less than or equal to 60 nm was formed. Note that the surface of the silicon oxide film was planarized also through the plasma treatment.

Next, an oxide semiconductor layer was formed in contact with the top surface, the upper end corner portion, and the side surface of the projecting structural body and a surface of a region in the silicon oxide film, where the projecting structural body was not formed. As the oxide semiconductor layer, an In—Ga—Zn—O film was formed to have a thickness of 40 nm by a sputtering method.

In the example sample 1, the oxide semiconductor layer (In—Ga—Zn—O film) was formed while the silicon substrate was heated to 400° C. Note that the In—Ga—Zn—O film in the example sample 1 was formed using an oxide target having a composition ratio of In:Ga:Zn=1:1:1 [atomic ratio] under the conditions where the distance between the silicon substrate and the target was 60 mm, the pressure was 0.4 Pa, the direct-current (DC) power was 0.5 kW, the atmosphere was an argon and oxygen atmosphere (the argon flow rate was 30 sccm, and the oxygen flow rate was 15 sccm), and the substrate temperature was 400° C. It is preferable that argon and oxygen used for formation of the oxide semiconductor layer do not contain water, hydrogen, and the like. For example, it is preferable that argon have a purity of 9N, a dew point of −121° C., a water content of 0.1 ppb, and a hydrogen content of 0.5 ppb and oxygen have a purity of 8N, a dew point of −112° C., a water content of 1 ppb, and a hydrogen content of 1 ppb.

Figure 13A:
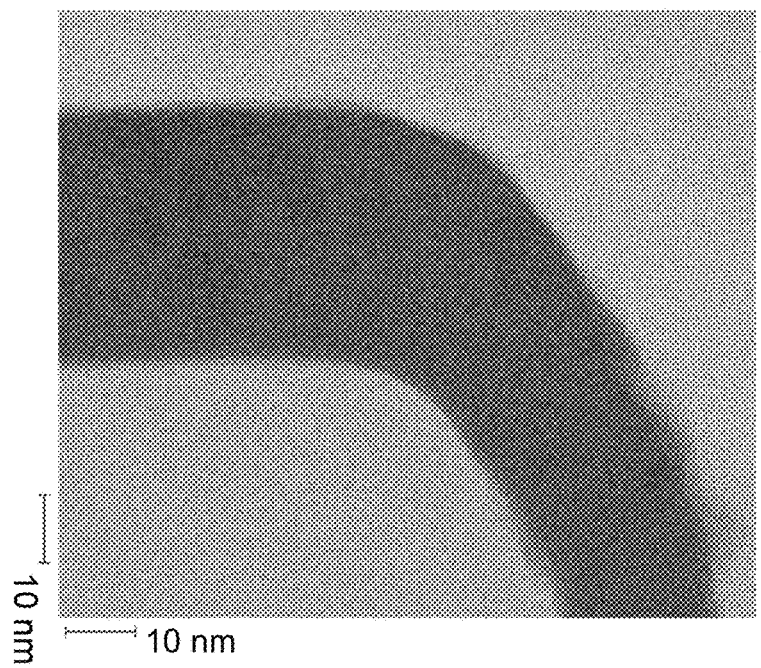
FIGS. 13A and 13B are cross-sectional TEM images of a sample according to one example of the present invention.
Figure 13B:
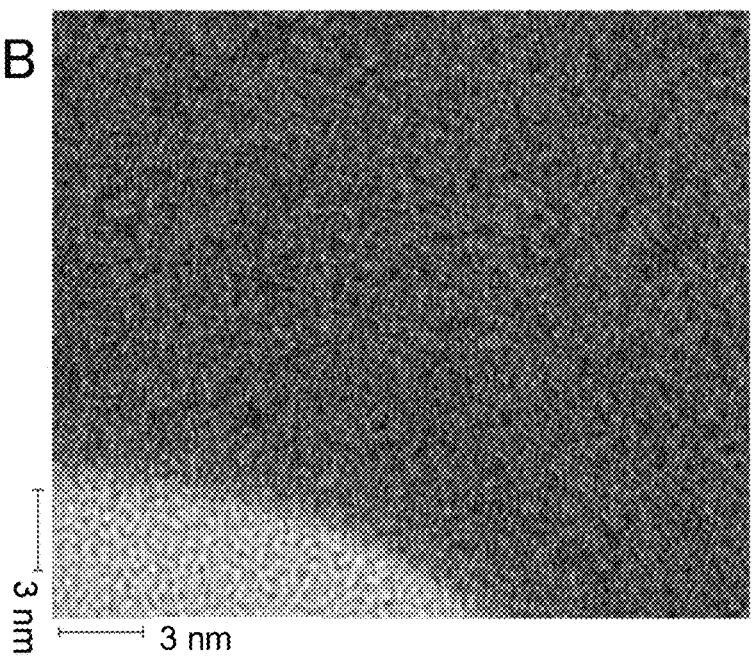

The example sample 1 obtained through the above steps was cut to expose a cross-section of the upper end corner portion, and the cross-section was observed with a high-resolution transmission electron microscope (TEM: "H9000-NAR" manufactured by Hitachi High-Technologies Corporation) at an acceleration voltage of 300 kV. FIG. 13A shows a TEM image of the example sample 1 at a magnification of 2 million times, and FIG. 13B shows a TEM image of the example sample 1 at a magnification of 8 million times.

As shown in FIG. 13A, the upper end corner portion of the projecting structural body is curved, and its radius of curvature is greater than or equal to 20 nm and less than or equal to 60 nm Over the curved upper end corner portion, the In—Ga—Zn—O film (CAAC-OS film) including a crystal having a c-axis substantially perpendicular to a surface can be identified. The crystal having a c-axis substantially perpendicular to a surface is more clearly shown in FIG. 13B at a higher magnification, and in the In—Ga—Zn—O film, a crystal state of layered In—Ga—Zn—O that is a plurality of layers stacked along the curved surface of the upper end corner portion can be identified.

This confirms that the oxide semiconductor layer formed in contact with the upper end corner portion of the projecting structural body in the example sample 1 is a crystalline oxide semiconductor layer including a crystal having a c-axis substantially perpendicular to a surface (a CAAC-OS layer), and a growth surface of the CAAC-OS layer has continuity over the curved upper end corner portion.

In such a transistor in which a crystalline oxide semiconductor layer including a crystal having a c-axis substantially perpendicular to a surface (a CAAC-OS layer) is provided over and in contact with a projecting structural body, the occurrence of a short-channel effect can be suppressed and the transistor is miniaturized. In addition, change in electric characteristics due to irradiation with visible light or ultraviolet light can be suppressed. Therefore, a highly reliable semiconductor device can be provided.

This application is based on Japanese Patent Application serial no. 2011-096298 filed with Japan Patent Office on Apr. 22, 2011, the entire contents of which are hereby incorporated by reference.

What is claimed is:

1. A method for manufacturing a semiconductor device, comprising:
    forming an insulating layer over a substrate, the insulating layer including a projecting structural body that includes a curved surface in an upper end corner portion where a top surface of the projecting structural body and a side surface of the projecting structural body intersect with each other;
    forming an oxide semiconductor layer over the insulating layer, the oxide semiconductor layer having a c-axis parallel to a normal vector of a surface of the oxide semiconductor layer;
    forming a source electrode and a drain electrode adjacent to the oxide semiconductor layer;
    forming a gate insulating layer adjacent to the oxide semiconductor layer; and
    forming a gate electrode adjacent to the gate insulating layer, wherein the gate insulating layer is interposed between a side surface of the oxide semiconductor layer and a side surface of the gate electrode; and
    forming a bit line electrically connected to the oxide semiconductor layer through one of the source electrode and the drain electrode.

2. The method for manufacturing a semiconductor device, according to claim 1,
    wherein the oxide semiconductor layer is in contact with at least a part of the top surface and the side surface of the projecting structural body,
    wherein a heat treatment is performed at a temperature higher than or equal to 400° C., when forming the oxide semiconductor layer, and
    wherein the oxide semiconductor layer includes a crystal having a c-axis substantially perpendicular to the curved surface.

3. The method for manufacturing a semiconductor device, according to claim 1,
    wherein plasma treatment is performed on the projecting structural body in a rare gas atmosphere to form the curved surface.

4. The method for manufacturing a semiconductor device, according to claim 3, wherein the rare gas is argon.

5. The method for manufacturing a semiconductor device, according to claim 1,
    wherein the projecting structural body is formed with the use of a metal mask, and
    wherein the curved surface is formed, when the metal mask is removed by dry etching using a reactive gas.

6. The method for manufacturing a semiconductor device, according to claim 1, wherein the curved surface has a radius of curvature greater than or equal to 20 nm and less than or equal to 60 nm.

7. A method for manufacturing a semiconductor device, comprising:
    forming an insulating layer over a substrate, the insulating layer including a projecting structural body that includes a curved surface in an upper end corner portion where a top surface of the projecting structural body and a side surface of the projecting structural body intersect with each other;

forming an oxide semiconductor layer having an amorphous state in contact with at least a part of the top surface and the side surface while heat treatment is performed at a temperature lower than 200° C.;

heating the oxide semiconductor layer at a temperature higher than or equal to 450° C. wherein the heated oxide semiconductor layer includes a crystal having a c-axis substantially perpendicular to the curved surface;

forming a source electrode and a drain electrode adjacent to the oxide semiconductor layer;

forming a gate insulating layer over the oxide semiconductor layer; and forming a gate electrode over the gate insulating layer to cover at least a part of the top surface and the side surface, wherein the gate insulating layer is interposed between a side surface of the oxide semiconductor layer and a side surface of the gate electrode; and forming a bit line electrically connected to the oxide semiconductor layer through one of the source electrode and the drain electrode.

8. The method for manufacturing a semiconductor device, according to claim 7, wherein plasma treatment is performed on the projecting structural body in a rare gas atmosphere to form the curved surface.

9. The method for manufacturing a semiconductor device, according to claim 8, wherein the rare gas is argon.

10. The method for manufacturing a semiconductor device, according to claim 7, wherein the projecting structural body is formed with the use of a metal mask, and wherein the curved surface is formed, when the metal mask is removed by dry etching using a reactive gas.

11. The method for manufacturing a semiconductor device, according to claim 7, wherein the curved surface has a radius of curvature greater than or equal to 20 nm and less than or equal to 60 nm.

12. A method for manufacturing a semiconductor device, comprising:

forming an insulating layer including a projecting structural body and a substrate;

forming an oxide semiconductor region over the insulating layer, the oxide semiconductor region having a c-axis parallel to a normal vector of a surface of the oxide semiconductor region;

forming an insulating region;

forming a first conductive region functioning as a word line, wherein the insulating region is interposed between a side surface of the oxide semiconductor region and a side surface of first conductive region; and forming a second conductive region functioning as a bit line, wherein the second conductive region is electrically connected to the oxide semiconductor region, wherein the oxide semiconductor region comprises a channel formation region.

13. The method for manufacturing a semiconductor device according to claim 12, wherein the channel formation region is extended in a three dimensional direction.

14. The method for manufacturing a semiconductor device according to claim 12, wherein the oxide semiconductor region comprises indium, gallium, and zinc.

15. The method for manufacturing a semiconductor device according to claim 12, wherein a memory comprises the oxide semiconductor region, the insulating region, the first conductive region, and the second conductive region.

* * * * *